(12) United States Patent
Ahn et al.

(10) Patent No.: US 11,682,811 B2
(45) Date of Patent: Jun. 20, 2023

(54) BATTERY PACK

(71) Applicant: LG ELECTRONICS INC., Seoul (KR)

(72) Inventors: Jiyoung Ahn, Seoul (KR); Dukho Ham, Seoul (KR); Seonghoon Han, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 101 days.

(21) Appl. No.: 17/185,014

(22) Filed: Feb. 25, 2021

(65) Prior Publication Data
US 2021/0265696 A1 Aug. 26, 2021

(30) Foreign Application Priority Data

Feb. 26, 2020 (KR) .................. 10-2020-0023798

(51) Int. Cl.
| *H01M 50/298* | (2021.01) |
| *H01M 50/204* | (2021.01) |
| *H01M 10/42* | (2006.01) |
| *G01R 31/382* | (2019.01) |
| *H01M 50/569* | (2021.01) |
| *H01M 50/581* | (2021.01) |

(52) U.S. Cl.
CPC ........ *H01M 50/298* (2021.01); *G01R 31/382* (2019.01); *H01M 10/425* (2013.01); *H01M 50/204* (2021.01); *H01M 50/569* (2021.01); *H01M 50/581* (2021.01); *H01M 2220/30* (2013.01)

(58) Field of Classification Search
None
See application file for complete search history.

(56) References Cited

U.S. PATENT DOCUMENTS

| 2009/0061302 A1* | 3/2009 | Scott ..................... H01M 50/51 |
| | | 29/730 |
| 2015/0180098 A1* | 6/2015 | Eckl .................... H01M 50/502 |
| | | 429/120 |
| 2019/0221852 A1* | 7/2019 | Nishimura ........ H01M 10/0525 |
| 2019/0296311 A1* | 9/2019 | Campbell ........... H01M 50/213 |
| 2021/0005855 A1* | 1/2021 | Götz ..................... H01M 50/20 |
| 2021/0043915 A1* | 2/2021 | Mantoku ........... H01M 10/0587 |
| 2021/0234239 A1* | 7/2021 | Kita .................... H01M 50/298 |

FOREIGN PATENT DOCUMENTS

| CN | 107305938 | 10/2017 |
| JP | H11-339766 | 12/1999 |
| JP | 2013-073929 | 4/2013 |
| JP | 2016-152922 | 8/2016 |
| KR | 10-2014-0130859 | 11/2014 |
| WO | WO 2020/013121 | 1/2020 |

\* cited by examiner

*Primary Examiner* — Carmen V Lyles-Irving
(74) *Attorney, Agent, or Firm* — Ked & Associates, LLP

(57) ABSTRACT

Provided is a battery pack including a plurality of battery cells for generating electrical energy; a lead frame for electrically connecting the plurality of battery cells; a sensor for measuring a status of at least one of the plurality of battery cells; and a wiring member for connecting the sensor and at least one of the plurality of battery cells, wherein the wiring member includes a wiring portion; and a fuse portion having a width smaller than that of the wiring portion.

16 Claims, 20 Drawing Sheets

BATTERY PACK

CROSS-REFERENCE TO RELATED APPLICATIONS

This application claims priority under 35 U.S.C. § 119 to Korean Application No. 10-2020-0023798 filed on Feb. 26, 2020, whose entire disclosure is hereby incorporated by reference. This application is related to U.S. application Ser. No. 17/165,178, filed on Feb. 2, 2021, whose entire disclosure is also hereby incorporated by reference.

BACKGROUND

1. Field

The present disclosure relates to a safety device of a sensing unit of a battery pack.

2. Background

In general, the demand for secondary batteries is also rapidly increasing due to the increase in technology development and demand for mobile devices, and among them, lithium (ion/polymer) secondary batteries with a high energy density and operating voltage and excellent storage and life characteristics are widely used as an energy source for not only various mobile devices but also various electronic products.

Korean Patent Application Laid-open No. 2014-0130859 discusses a pouch-type secondary battery with improved safety, and in the pouch-type secondary battery, a channel is formed inside a cell and in a sealing portion of an electrode tab. When a gas is excessively generated inside a pouch due to a cause such as overcharging or an internal short circuit and a pressure is thus increased, the gas may be discharged to the outside of the pouch through the channel. That is, when the gas inside the cell is discharged to the outside, the gas is always discharged through the sealing portion of the electrode tab, so that a discharge direction of the gas can be predicted in advance.

However, channels are formed at upper and lower surfaces of the pouch, electrodes are disposed at the upper and lower surfaces of the pouch, and an outer lead frame and the upper and lower surfaces of the pouch are welded by a resistance welding machine for connection. During a welding process in which channels are formed at the upper and lower surfaces of the pouch, there is a problem that the channels are opened or damaged, thereby damaging battery cells. Further, when a channel is formed at the upper surface or the lower surface of the pouch, if an exhaust gas inside the battery cell is discharged, there is a problem that the battery cell is discharged to the outside of a battery pack. Further, in the case of the prior art, a safety device of a sensing unit of the battery pack is not provided, and thus, when a circuit for the sensing unit is heated, there is a problem of causing a fatal defect in operation of the battery and deteriorating the stability of the battery.

The above reference is incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Figure 1:
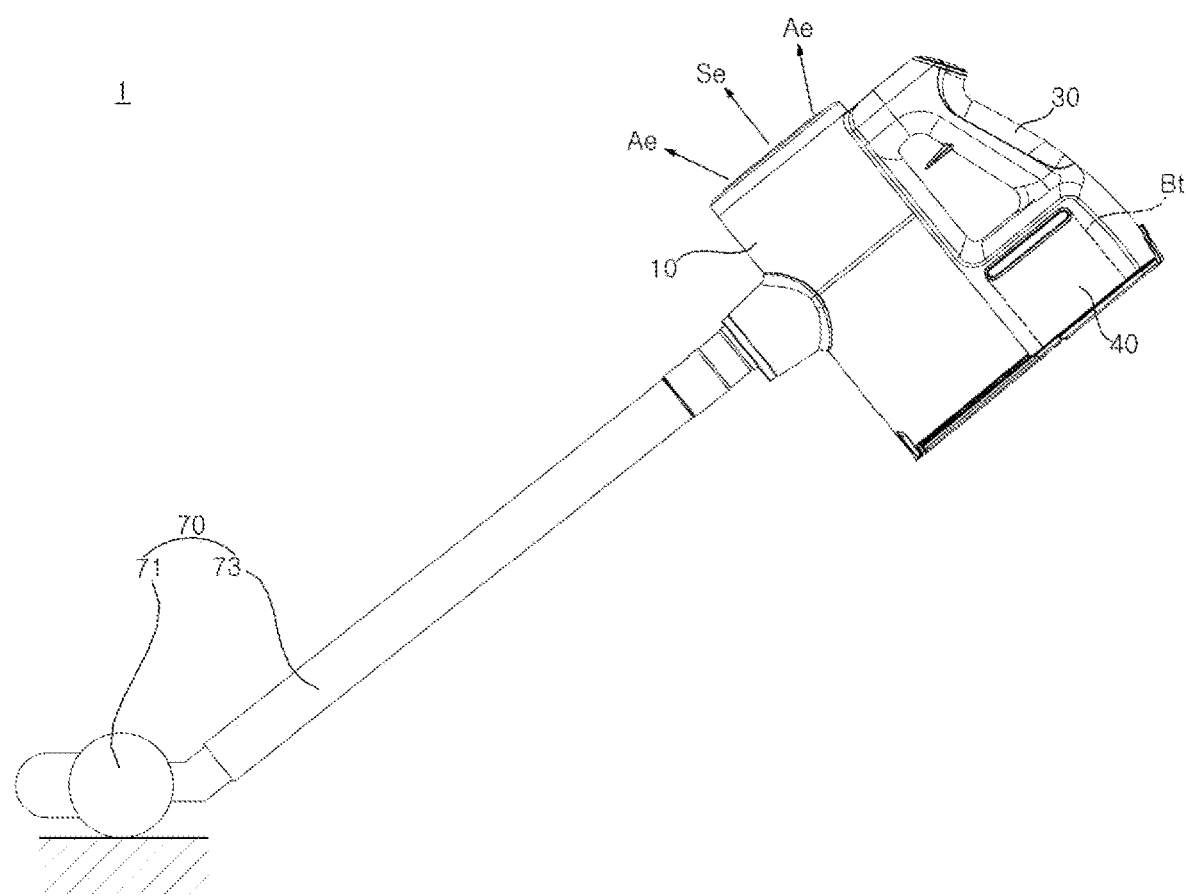
FIG. 1 is a side elevation view illustrating a use state of a cleaner according to an embodiment of the present disclosure.

Hereinafter, the present disclosure will be described based on a spatial rectangular coordinate system formed by an X-axis, Y-axis, and Z-axis that are orthogonal to each other. Each axis direction (X-axis direction, Y-axis direction, Z-axis direction) means both directions in which each axis extends. A '+' sign in front of each axis direction (+X-axis direction, +Y-axis direction, +Z-axis direction) means a positive direction, which is one of both directions in which each axis extends. A '−' sign in front of each axis direction (−X-axis direction, −Y-axis direction, −Z-axis direction) means a negative direction, which is the other direction of both directions in which each axis extends.

Expressions referring to directions such as "front(+Y)/rear(−Y)/left(+X)/right(−X)/up(+Z)/down(−Z)" mentioned below are defined according to the XYZ coordinate axis, but this is for describing so that the present disclosure may be clearly understood, and directions may be defined differently according to where the reference is placed.

The use of terms such as 'first, second, and third' in front of elements mentioned below is only to avoid confusion of elements to be referred to and is irrelevant to the order, importance, or master-slave relationship between elements.

For example, a disclosure including only a second component without a first component may be implemented. Singular expressions used in the present disclosure include plural expressions unless the context clearly indicates otherwise.

A cleaner according to the present disclosure may be a manual cleaner or a robot cleaner. Hereinafter, a cleaner 1 according to the present embodiment will be described only as a hand-held manual cleaner, but the cleaner according to the present disclosure need not be limited thereto.

<Cleaner Including Battery>

Referring to FIGS. 1 to 6, a cleaner 1 according to an embodiment includes a main body 10 for forming a flow path P for guiding sucked air to be discharged to the outside. The cleaner 1 includes a dust separator 20 disposed on the flow path P to separate dust from the air. The cleaner 1 includes a handle 30 coupled to the rear side of the main body 10.

The cleaner 1 includes a battery Bt for supplying power and a battery housing 40 for receiving the battery Bt. The cleaner 1 includes fan modules 50 and 50' disposed on the flow path P to move air in the flow path. In addition to the dust separator 20, the cleaner 1 includes filters 61 and 62 disposed on the flow path P to separate dust from the air.

The cleaner 1 includes a nozzle module 70 detachably connected to a suction pipe 11 of the main body 10. The cleaner 1 includes an input unit 3 for enabling a user to input on/off or a suction mode thereof, and an output unit 4 for displaying various statuses thereof to the user.

The cleaner 1 includes noise control modules 80, 80', 180, 280, 380, and 980 for performing at least one of i) a first function of reducing the loudness of noise in a relatively low band range among audible frequencies, and ii) a second function of increasing the loudness of noise in a relatively high band range among audible frequencies. The noise control module includes speakers 89 and 989 for outputting a sound. According to the embodiment, the cleaner 1 may further include a sound transfer pipe 90 for transferring a sound from the speakers 89 and 989 to sound emission ports 10b and 10b'.

Referring to FIG. 1, the nozzle module 70 includes a nozzle portion 71 provided to suck external air and an extension pipe 73 long extended from the nozzle portion 71. The extension pipe 73 connects the nozzle portion 71 and the suction pipe 11. The extension pipe 73 guides the air sucked from the nozzle portion 71 to be introduced into the suction flow path P1. One end of the extension pipe 73 may be detachably coupled to the suction pipe 11 of the main body 10. The user may clean while holding the handle 30 and moving the nozzle portion 71 in a state in which the nozzle portion 71 is placed on the bottom.

Referring to FIGS. 2 to 6, the main body 10 forms an external shape of the cleaner 1. The main body 10 may be formed in a vertically long cylindrical shape as a whole. The dust separator 20 is received inside the main body 10. The fan modules 50 and 50' are received in the main body 10. The handle 30 is coupled to the rear side of the main body 10. The battery housing 40 is coupled to the rear side of the main body 10.

The main body 10 includes a suction pipe 11 for guiding the suction of air therein. The suction pipe 11 forms a suction flow path P1. The suction pipe 11 may be protruded forward the main body 10.

The main body 10 includes discharge covers 12 and 12' for forming exhaust ports 10a and 10a', respectively. The discharge covers 12 and 12' may further form sound emission ports 10b and 10b', respectively. The discharge covers 12 and 12' may form an upper surface of the main body 10. The discharge covers 12 and 12' cover an upper side of a fan module housing 14.

The main body 10 includes a dust collection portion 13 for storing dust separated from the dust separator 20. At least a part of the dust separator 20 may be disposed in the dust collection portion 13. An inner surface of the upper part of the dust collection portion 13 may perform a function of a first cyclone portion 21 to be described later. In this case, the upper part of the dust collection portion 13 may be referred to as the first cyclone portion 21. A second cyclone portion 22 and a dust flow guide 24 are disposed inside the dust collection portion 13.

The dust collection portion 13 may be formed in a cylindrical shape. The dust collection portion 13 is disposed under the fan module housing 14. Dust storage spaces S1 and S2 are formed inside the dust collection portion 13. A first storage space S1 is formed between the dust collection portion 13 and the dust flow guide 24. A second storage space S2 is formed inside the dust flow guide 24.

The main body 10 includes a fan module housing 14 for receiving the fan modules 50 and 50' therein. The fan module housing 14 may be extended upward from the dust collection portion 13. The fan module housing 14 is formed in a cylindrical shape. An extension portion 31 of the handle 30 is disposed at the rear side of the fan module housing 14.

The main body 10 includes a dust cover 15 provided to open and close the dust collection portion 13. The dust cover 15 may be rotatably coupled to the lower side of the dust collection portion 13. The dust cover 15 may open and close the lower side of the dust collection portion 13 by a rotation operation. The dust cover 15 may include a hinge (not illustrated) for rotation. The hinge may be coupled to the dust collection portion 13. The dust cover 15 may open and close the first storage space S1 and the second storage space S2 together.

The main body 10 includes an air guide 16 for guiding the air discharged from the dust separator 20. The air guide 16 forms fan module flow paths P4 and P4' for guiding air from the dust separator 20 to impellers 51 and 51'. The air guide 16 includes exhaust flow paths P5 and P5' for guiding the air passing through the impellers 51 and 51' to the exhaust ports 10a and 10a'. The air guide 16 may be disposed within the fan module housing 14.

Figure 6:
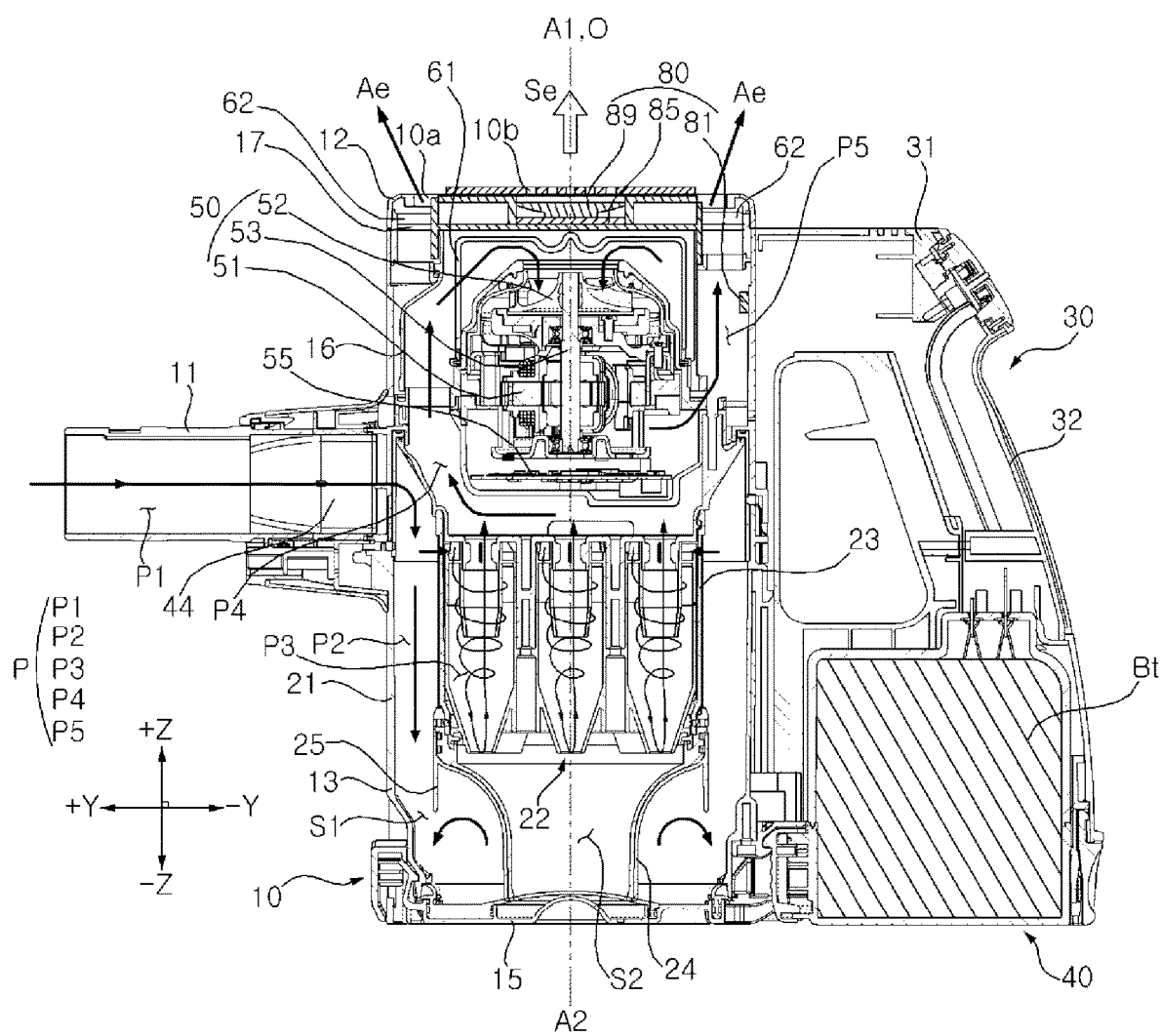
FIG. 6 is a cross-sectional view of the cleaner 1 of FIG. 4A vertically taken along line S2-S2'.

For example, referring to FIG. 6, the air guide 16 may form flow paths P4 and P5 so that the air discharged from the dust separator 20 rises, passes through the impeller 51, descends, and rises again to the exhaust ports 10a and 10a'. As another example, the air guide 16 may form flow paths P4' and P5' so that the air discharged from the dust separator 20 passes through the impeller 51 and continues to rise to the exhaust ports 10a and 10a'.

Referring to FIGS. 2, 4A, 4B, and 6, the main body 10 has exhaust ports 10a and 10a' for discharging air in the flow path P to the outside of the main body 10. The exhaust ports 10a and 10a' may be formed in the exhaust covers 12 and 12'.

The exhaust ports 10a and 10a' may be disposed at one surface of the main body 10. The exhaust ports 10a and 10a' may be formed at an upper side of the main body 10. Thereby, it is possible to prevent a phenomenon that the air discharged from the exhaust ports 10a and 10a' directly hits the user while preventing dust around the cleaner from being scattered by the air discharged from the exhaust ports 10a and 10a'. Further, the sound emission port may be disposed at the same surface as that in which the exhaust ports 10a and 10a' are formed among surfaces of the main body 10.

The exhaust ports 10a and 10a' may be disposed to face a specific direction (e.g., upward direction). A discharge direction Ae of the air discharged through the exhaust ports 10a and 10a' may be a specific direction.

In the present description, a predetermined axis O means a virtual axis extended in a specific direction while crossing the center of the main body 10. A 'centrifugal direction' means a direction away from the axis O, and a 'centrifugal opposite direction' means a direction closer to the axis O. Further, a 'circumferential direction' means a circumferential direction (or rotational direction) around the axis O. The circumferential direction is meant to encompass clockwise and counterclockwise directions.

An air discharge direction Ae may be a direction between a specific direction and a centrifugal direction. The air discharge direction Ae may be a direction between a specific direction and a circumferential direction. Specifically, the air discharge direction Ae may be a direction between a specific direction and a counterclockwise direction. The air discharge direction Ae may be a direction in which a specific direction, a centrifugal direction, and a circumferential direction are three-dimensionally combined.

The exhaust ports 10a and 10a' may be disposed to enclose the axis O. The exhaust ports 10a and 10a' may be arranged or extended along the circumferential direction. The exhaust ports 10a and 10a' may be disposed in predetermined peripheral areas B1 and B1' extended over a central angle of 180 degrees along a circumferential direction around a predetermined axis O.

Figure 4A:
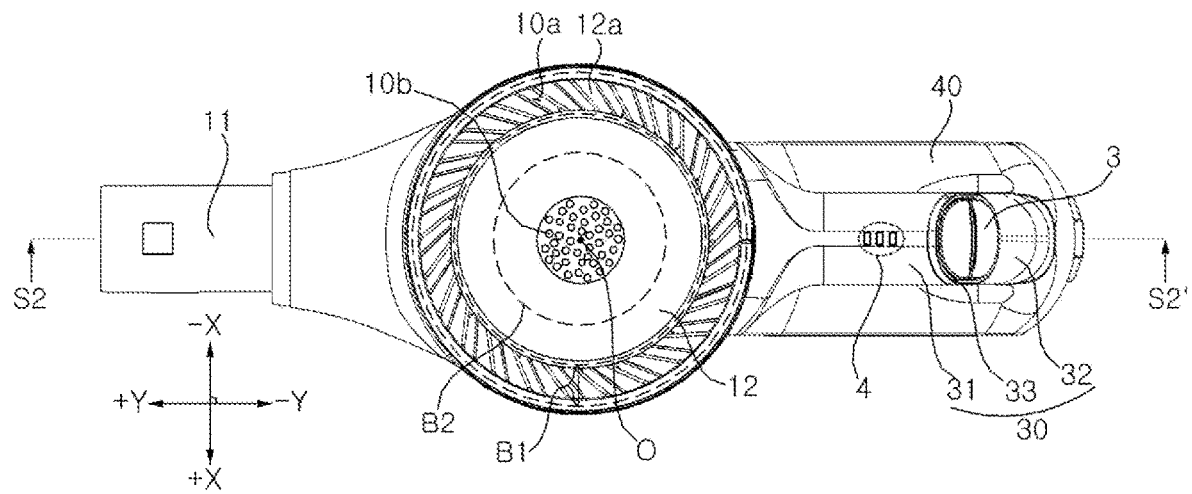
FIG. 4A is a top elevation view of the cleaner 1 of FIG. 2.

For example, referring to FIG. 4A, the peripheral area B1' is extended by a central angle 360 degrees along the circumferential direction around the axis O. That is, the peripheral area B1 completely encloses the circumference of the axis O.

Figure 4B:
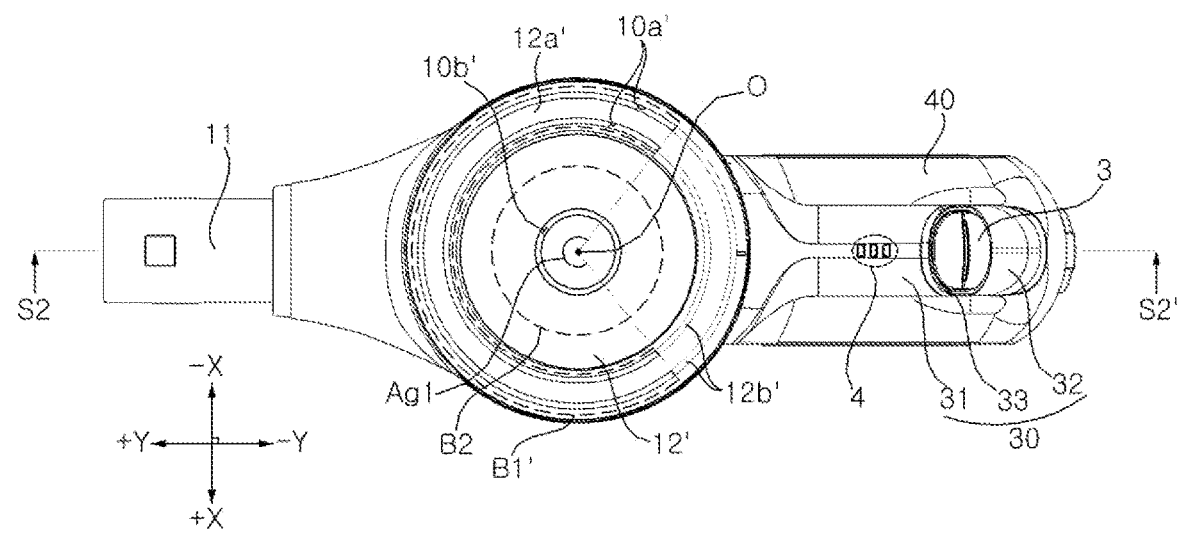
FIG. 4B is a top elevation view of a cleaner 1 according to another embodiment.

As another example, referring to FIG. 4B, a peripheral area B1' is extended by a central angle Ag1 along the circumferential direction around the axis O. Here, the central angle Ag1 may have a value of 270 degrees or more and less than 360 degrees. In FIG. 4A, the central angle Ag1 is about 270 degrees.

Referring to FIG. 4B, it is preferable that a direction in which the peripheral area B1' is not enclosed based on the axis O is a direction (rear) in which the handle 30 is disposed. The exhaust port 10a' may not be formed in an area between the axis O and the handle 30 so that the air discharged from the exhaust port 10a' is prevented from flowing toward the user. A barrier 12b' for blocking air discharge may be provided in an area between the axis O and the handle 30. Thereby, it is possible to prevent the air discharged from the exhaust port 10a' from directly hitting the user holding the handle 30.

The exhaust ports 10a and 10a' may be i) extended along the circumferential direction or ii) arranged along the circumferential direction by dividing into a plurality of pieces in the peripheral areas B1 and B1'. For example, referring to FIG. 4A, a plurality of exhaust ports 10a are arranged along the peripheral area B1. The plurality of exhaust ports 10a are divided from each other in the circumferential direction by the plurality of exhaust guides 12a. The plurality of exhaust ports 10a may be arranged at predetermined intervals apart from each other along the circumferential direction.

As another example, referring to FIG. 4B, the exhaust port 10a' is extended long along the peripheral area B1'. A plurality of exhaust ports 10a' may be disposed to be spaced apart from each other in a centrifugal direction. The plurality of exhaust ports 10a' are divided from each other in the centrifugal direction by the exhaust guide 12a'. Each of the exhaust ports 10a' may be extended in the circumferential direction by a central angle Ag1 about the axis O.

The main body 10 includes exhaust guides 12a and 12a' provided to discharge air discharged through the exhaust ports 10a and 10a' in a direction inclined based on the axis O. The exhaust guides 12a and 12a' may be disposed to be inclined based on the axis O. The exhaust covers 12 and 12' may include exhaust guides 12a and 12a' for dividing the exhaust ports 10a and 10a' into a plurality of pieces.

For example, referring to FIG. 4A, the exhaust cover 12 includes a plurality of exhaust guides 12a for dividing the exhaust port 10a into a plurality of pieces. The plurality of exhaust guides 12a are arranged to be spaced apart along the circumferential direction. Each exhaust guide 12a is extended in a direction between a circumferential direction and a centrifugal direction, and divides two adjacent exhaust ports 10a. A space apart between the two adjacent exhaust guides 12a becomes the exhaust port 10a. The exhaust guide 12a guides air to be discharged in a direction in which a specific direction, a centrifugal direction, and a circumferential direction are three-dimensionally combined.

As another example, referring to FIG. 4B, the exhaust cover 12' includes one exhaust guide 12a' for dividing the exhaust port 10a' into two. The exhaust guide 12a' is extended long along the circumferential direction. The exhaust guide 12a' is extended in the circumferential direction from one end of the barrier 12b' to the other end by a central angle Ag1 around the axis O. The exhaust guide 12a' guides air to be discharged in a direction in which a specific direction and a centrifugal direction are combined.

Referring to FIGS. 2, 4A, 4B, and 6, the main body 10 forms sound emission ports 10b and 10b' for emitting a sound from the speakers 89 and 989. The sound emission ports 10b and 10b' may be formed in the discharge covers 12 and 12'. The sound emission ports 10b and 10b' may be formed at the upper side of the main body 10. The sound emission ports 10b and 10b' may be disposed to face a specific direction (e.g., upward direction). An emission direction Se of a sound emitted through the sound emission ports 10b and 10b' becomes a specific direction.

The sound emission ports 10b and 10b' are preferably provided separately from the exhaust ports 10a and 10a'. Thereby, it is possible to prevent the effect of air or dust moving in the flow path P on a performance of the speakers 89 and 989.

It is preferable that the exhaust ports 10a and 10a' and the sound emission ports 10b and 10b' face the same direction based on the main body 10. Thereby, when the noise emitted through the exhaust ports 10a and 10a' and the sound emitted through the sound emission ports 10b and 10b' are synthesized to reach the user's ear, it is possible to reduce a phenomenon in which a ratio between the loudness of the noise and the loudness of the sound varies according to a position of the user's ear, and to synthesize the sound with the noise at a preset ratio.

The sound emission ports 10b and 10b' may be disposed at the center of the discharge covers 12 and 12'. The sound emission ports 10b and 10b' may be disposed in a centrifugal opposite direction of the peripheral areas B1 and B1' based on the axis O. The sound emission ports 10b and 10b' may be disposed in a central portion through which the axis O passes. The sound emission ports 10b and 10b' may be spaced apart in the centrifugal opposite direction in the peripheral areas B1 and B1' and be disposed in a predetermined central area B2 through which the axis O passes. Thereby, it is possible to place a sound generation area by the sound emission ports 10b and 10b' at the center of a noise generation area by the exhaust ports 10a and 10a', and noise by the exhaust ports 10a and 10a' and a sound by the speakers 89 and 989 may be destructive interference or constructive interference as preset. This is particularly effective in canceling out (destructive interference) a low band frequency range of the generated noise with the 180 degree phase-shifted sound of the speakers 89 and 989.

Figure 2:
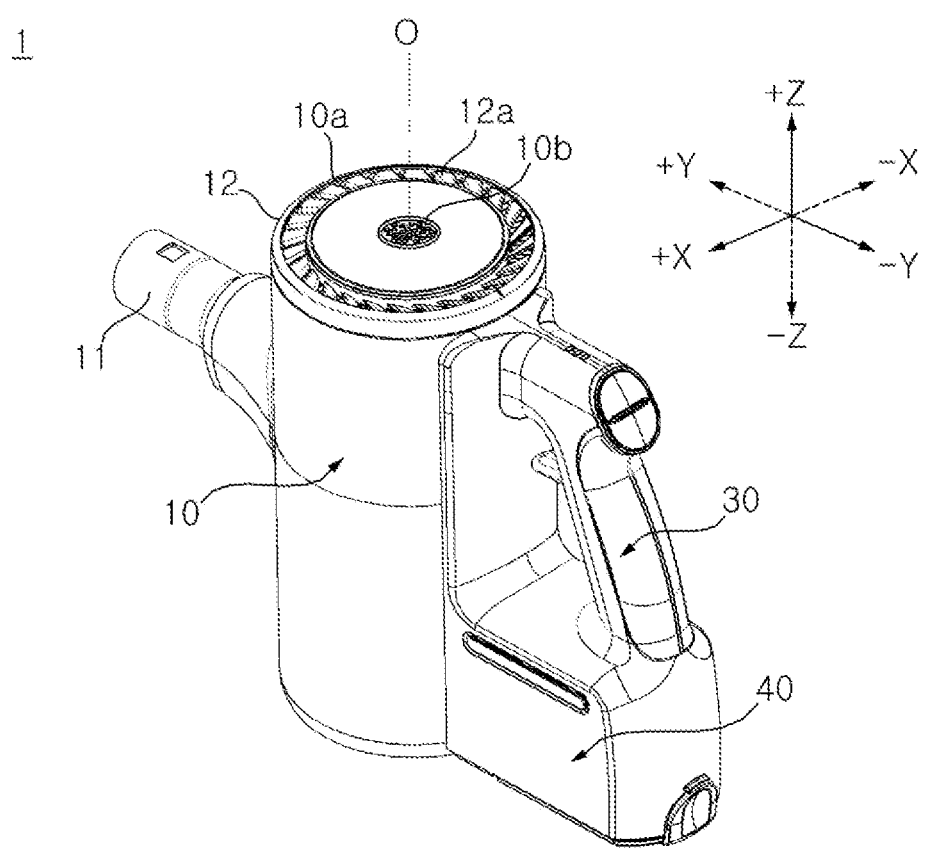
FIG. 2 is a perspective view illustrating a cleaner 1 in which a nozzle module 70 is removed from FIG. 1.
Figure 3:
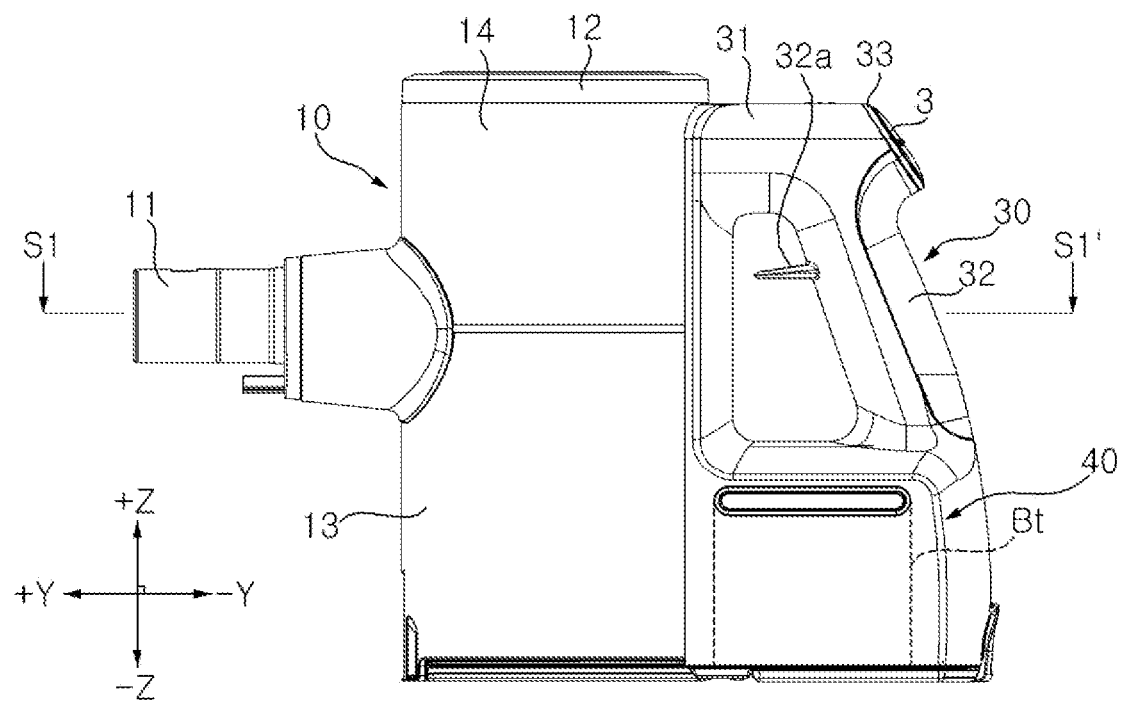
FIG. 3 is a side elevation view of the cleaner 1 of FIG. 2.

As an example, referring to FIG. 2, the sound emission port 10b may include a plurality of holes formed to be spaced apart from each other in the central area B2. As another example, referring to FIG. 4B, a mesh type structure may be disposed in the central area B2, and a large number of holes formed by the mesh type structure may perform a function of the sound emission port 10b.

As another example, referring to FIG. 4B, the sound emission port 10b' may include a gap long extended in the circumferential direction about the axis O within the central area B2. Specifically, the sound emission port 10b' may include a ring-shaped gap.

Figure 5:
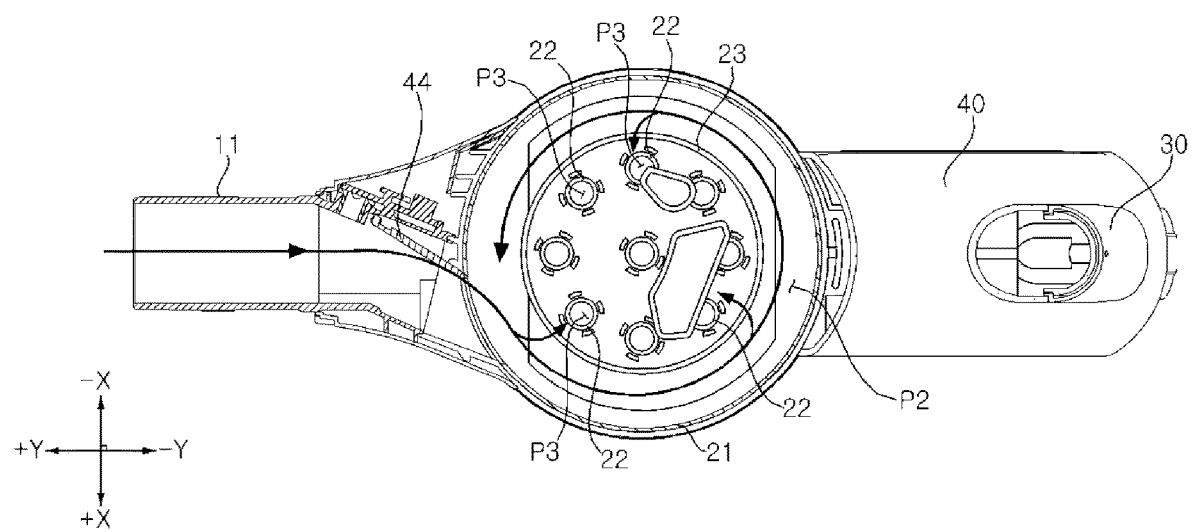
FIG. 5 is a plan view of the cleaner 1 of FIG. 3 horizontally taken along line S1-S1'.

Referring to FIGS. 5 to 6C, the dust separator 20 performs a function of filtering dust on the flow path P. The dust separator 20 separates dust sucked into the main body 10 through the suction pipe 11 from the air.

As an example, the dust separator 20 may include a first cyclone portion 21 and a second cyclone portion 22 capable of separating dust by cyclone flow. A flow path P2 formed by the first cyclone portion 21 may be connected to a suction flow path P1 formed by the suction pipe 11. Air and dust sucked through the suction pipe 11 helically flow along an inner circumferential surface of the first cyclone portion 21.

An axis A2 of cyclone flow of the first cyclone portion 21 may be extended in a vertical direction. The axis A2 of the cyclone flow may coincide with the axis O. The second cyclone portion 22 additionally separates dust from the air that has passed through the first cyclone portion 21. The second cyclone portion 22 may be located inside the first cyclone portion 21. The second cyclone portion 22 may be located inside a boundary portion 23. The second cyclone portion 22 may include a plurality of cyclone bodies disposed in parallel.

As another example, the dust separator 20 may have a single cyclone portion. Even in this case, the axis A2 of cyclone flow may be extended in a vertical direction.

As another example, the dust separator 20 may include a main filter portion (not illustrated) instead of a cyclone portion. The main filter portion may separate dust from the air introduced from the suction pipe 11.

Hereinafter, the dust separator 20 will be described based on the present embodiment including the first cyclone portion 21 and the second cyclone portion 22, but is not necessarily limited thereto. The dust separator 20 forms dust separation flow paths P2 and P3. The air moves the dust separation flow paths P2 and P3 at a high speed to separate the dust therefrom, and the separated dust is stored in the first dust storage space S1.

A space between an inner circumferential surface of the first cyclone portion 21 and an outer circumferential surface of the boundary portion 23 becomes the flow path P2 of first cyclone. The air passing through the suction flow path P1 moves in a downward spiral direction in the flow path P2 of first cyclone, and dust in the air is centrifuged. Here, the axis A2 becomes the flow axis A2 in the downward spiral direction.

The dust separator 20 includes a boundary portion 23 disposed in a cylindrical shape inside the first cyclone portion 21. The boundary portion 23 forms a plurality of holes at the outer circumferential surface. Air in the first cyclone flow path P2 may pass through the plurality of holes of the boundary portion 23 and be introduced into the second cyclone flow path P3. The bulky dust may be filtered by a plurality of holes in the boundary portion 23.

The upper side of the second cyclone portion 22 is disposed inside the boundary portion 23. The second cyclone portion 22 includes a plurality of cyclone bodies having an empty interior and penetrated vertically. Each cyclone body may be formed in a pipe shape that tapers downward. The second cyclone flow path P3 is formed inside each cyclone body. The air passing through the boundary portion 23 moves to the second cyclone flow path P3 along a guide for guiding air flow in a downward spiral direction disposed at the upper side of the cyclone body. The air spirally moves downward along the inner circumferential surface of the cyclone body, the dust in the air is centrifuged, and the separated air is stored in the second storage space S2. The air that has moved to the lower side of the cyclone body along the second cyclone flow path P3 moves in an upward direction along a central axis in the vertical direction of the second cyclone flow path P3, and is introduced into the fan module flow paths P4 and P4'.

The dust separator 20 includes a dust flow guide 24 for dividing the first storage space S1 and the second storage space S2 within the dust collection portion 13. A space between the dust flow guide 24 and an inner surface of the dust collection portion 13 is a first storage space S1. An internal space of the dust flow guide 24 is the second storage space S2.

The dust flow guide 24 is coupled to the lower side of the second cyclone portion 22. The dust flow guide 24 contacts the upper surface of the dust cover 15. A portion of the dust flow guide 24 may be formed to decrease in diameter as advancing from the top to the bottom. As an example, the upper portion of the dust flow guide 24 may have a smaller diameter toward the lower side, and the lower portion of the dust flow guide 24 may be formed in a cylindrical shape extended vertically.

The dust separator 20 may include a scattering prevention rib 25 extended downward from the upper end of the dust flow guide 24. The dust separator 20 may enclose a periphery of the upper portion of the dust flow guide 24. The scattering prevention rib 25 may be extended along a circumferential direction about the flow axis A2. For example, the scattering prevention rib 25 may be formed in a cylindrical shape.

When the upper portion of the dust flow guide 24 is formed to have a smaller diameter toward the lower side, a space is formed between an outer peripheral surface of the upper portion of the dust flow guide 24 and the scattering prevention rib 25. When the rising flow of air occurs along the dust flow guide 24 in the first storage space S1, rising dust is caught by the space between the scattering prevention rib 25 and the upper portion of the dust flow guide 24. Thereby, it is possible to prevent the dust in the first storage space S1 from flowing backward to the upside.

The handle 30 is coupled to the main body 10. The handle 30 may be coupled to the rear side of the main body 10. The handle 30 may be coupled to the upper side of the battery housing 40.

The handle 30 includes an extension portion 31 protruded and extended from the main body 10 to the rear. The extension portion 31 may be extended forward from the upper part of an additional extension portion 32. The extension portion 31 may be extended in a horizontal direction. In an embodiment B, which will be described later, the speaker 989 is disposed inside the extension portion 31.

The handle 30 is extended in a vertical direction and includes an additional extension portion 32. The additional extension portion 32 may be spaced apart from the main body 10 in the front-rear direction. The user may use the cleaner 1 while holding the additional extension portion 32. The upper end of the additional extension portion 32 is connected to the rear end of the extension portion 31. The lower end of the additional extension portion 32 is connected to the battery housing 40.

The additional extension portion 32 may be provided with a movement limiting portion 32a for preventing the hand from moving in a length direction (up and down direction) of the additional extension portion 32 in a state in which the user holds the additional extension portion 32. The movement limiting portion 32a may be protruded forward from the additional extension portion 32.

The movement limiting portion 32a is disposed to be vertically spaced apart from the extension portion 31. In a state in which the user is holding the additional extension portion 32, some fingers of the user's holding hand are located over the movement limiting portion 32a, and the remaining fingers are located under the movement limiting portion 32a.

The handle 30 may include an inclined surface 33 facing a direction between the upper side and the rear side. The inclined surface 33 may be located at the rear of the extension portion 31. The input unit 3 may be disposed at the inclined surface 33.

The battery Bt may supply power to the fan modules 50 and 50'. The battery Bt may supply power to the noise control module. The battery Bt may be detachably disposed inside the battery housing 40. The battery Bt may include at least one battery pack 200.

The battery housing 40 is coupled to the rear side of the main body 10. The battery housing 40 is disposed under the handle 30. The battery Bt is received in the battery housing 40. A heat dissipation hole for discharging a heat generated in the battery Bt to the outside may be formed in the battery housing 40.

Referring to FIG. 6, the fan modules 50 and 50' generate a suction force so that external air flows into the flow path P. The fan modules 50 and 50' are disposed within the main body 10. The fan modules 50 and 50' are disposed under the sound emission ports 10b and 10b'. The fan modules 50 and 50' are disposed over the dust separator 20.

The fan modules 50 and 50' include impellers 51 and 51' for generating a suction force by rotation. The impellers 51 and 51' pressurize air so that the air in the flow path P is discharged through the exhaust ports 10a and 10a'. When the impellers 51 and 51' pressurize air, noise and vibration occur, and these noises are mainly emitted through the exhaust ports 10a and 10a'.

An extension line of the rotation axis A1 (which may also be referred to as an axis of the suction motor) of the impellers 51 and 51' may coincide with the flow axis A2. Further, the rotation axis A1 may coincide with the axis O. In this case, the impellers 51 and 51' rotate around the axis O to press the air. Thereby, noise may be relatively evenly emitted through the exhaust ports 10a and 10a' formed in the peripheral areas B1 and B1'.

The fan modules 50 and 50' include suction motors 52 and 52', respectively for rotating the impeller 51. The suction motors 52 and 52' may be the only motors of the cleaner 1. The suction motors 52 and 52' may be located over the dust separator 20. When the suction motors 52 and 52' operate, noise and vibration occur, and these noises are mainly emitted through the exhaust ports 10a and 10a'.

For example, referring to FIG. 6, the fan module 50 in which the impeller 51 is disposed under the suction motor 52 may be provided. The impeller 51 pressurizes air in an upward direction when rotating. As another example, the fan module 50' in which the impeller 51' is disposed under the suction motor 52' may be provided. The impeller 51' pressurizes air in a downward direction when rotating.

The fan modules 50 and 50' may include a shaft 53 fixed to the center of the impellers 51 and 51', respectively. The shaft 53 is disposed to extend in a vertical direction on the rotation shaft A1. The shaft 53 may function as a motor shaft of the suction motor 52.

The cleaner 1 may include a printed circuit board (PCB) 55 for controlling the suction motors 52 and 52'. The PCB 55 may be disposed between the suction motor 52 and the dust separator 20.

The cleaner 1 may include a pre-filter 61 for filtering air before air is sucked into the suction motors 52 and 52'. The pre-filter 61 may be disposed to enclose the impeller 51. Air on the fan module flow paths P4 and P4' passes through the pre-filter 61 to reach the impeller 51. The pre-filter 61 is disposed inside the main body 10. The pre-filter 61 is disposed under the discharge covers 12 and 12'. By separating the discharge covers 12 and 12' from the cleaner 1, the user may remove the pre-filter 61 from the inside of the main body 10.

The cleaner 1 may include a high-efficiency particulate air (HEPA) filter 62 for filtering air before the air is discharged to the exhaust ports 10a and 10a'. The air that has passed through the impellers 51 and 51' may pass through the HEPA filter 62 and then be discharged to the outside through the exhaust port 10a. The HEPA filter 62 is disposed on the exhaust flow path P5.

The discharge covers 12 and 12' may form a filter reception space (not illustrated) for receiving the HEPA filter 62. The filter reception space may be formed to open the lower side and thus the HEPA filter 62 may be received in the filter reception space in a lower side of the discharge covers 12 and 12'. An exhaust port 10a may be formed to face the HEPA filter 62. The HEPA filter 62 is disposed under the exhaust ports 10a and 10a'. The HEPA filter 62 may be disposed to extend in a circumferential direction along the exhaust ports 10a and 10a'.

The main body 10 includes a filter cover 17 for covering the lower side of the HEPA filter 62. In a state in which the HEPA filter 62 is received in a filter reception space, the lower side of the HEPA filter 62 is covered by the filter cover 17, and the filter cover 17 has a hole for passing through air in the exhaust flow path P5. The filter cover 17 may be detachably coupled to the discharge covers 12 and 12'.

The discharge covers 12 and 12' may be detachably coupled to the fan module housing 14. When the filter cover 17 is separated from the exhaust covers 12 and 12' separated from the fan module housing 14, the HEPA filter 62 may be removed from the filter reception space. In the present disclosure, it has been described that the cleaner 1 includes the pre-filter 61 and the HEPA filter 62, but there is no limitation on the type and number of filters.

The input unit 3 may be located at the opposite side of the movement limiting unit 32a based on the handle 30. The input unit 3 may be disposed at the inclined surface 33. Further, the output unit 4 may be disposed in the extension portion 31. For example, the output unit 4 may be located at an upper surface of the extension portion 31. The output unit 4 may include a plurality of transmitters 111. The plurality of transmitters 111 may be arranged to be spaced apart in a length direction (front and rear direction) of the extension portion 31.

Referring to FIGS. 5 to 6, the flow path P is formed by sequentially connecting a suction flow path P1, dust separation flow paths P2 and P3, fan module flow paths P4 and P4', and exhaust flow paths P5 and P5'. In particular, referring to FIG. 5, the suction flow path P1 provides external air to the dust separator 20. The suction flow path P1 is connected to the dust separator 20. Specifically, the suction flow path P1 may be defined by the suction pipe 11, a part of the suction flow path P1 may be exposed to the outside of the main body 10, and the other side of the suction flow path P1 may be located within the main body 10. One side of the suction flow path P1 may be coupled to the extension pipe 73 connected to the nozzle portion 71. The air in the suction flow path P1 is moved by the fan module.

A flap door 44 for opening and closing the suction pipe 11 is installed in the suction pipe 11. Air and dust sucked through the suction flow path P1 by an operation of the suction motors 52 and 52' flow in the first flow path P2 and the second cyclone flow path P3 and are separated from each other. In the second cyclone flow path P3, air moves upward as described above, and is introduced into the fan module flow paths P4 and P4'.

The fan module flow paths P4 and P4' guide air toward the pre-filter 61. Air that has sequentially passed through the pre-filter 61 and the impeller 51 flows into the exhaust flow paths P5 and P5'. The air in the exhaust flow paths P5 and P5' passes through the HEPA filter 62 and is then discharged to the outside through the exhaust ports 10a and 10a'.

The fan module flow path P4 guides the air so that the air discharged from the dust separator 20 rises and passes through the impeller 51 and descends. Here, the exhaust flow path P5 guides the air so that the air descending while passing through the impeller 51 again rises to the exhaust ports 10a and 10a'.

First Embodiment, Battery Pack

Figure 7A:
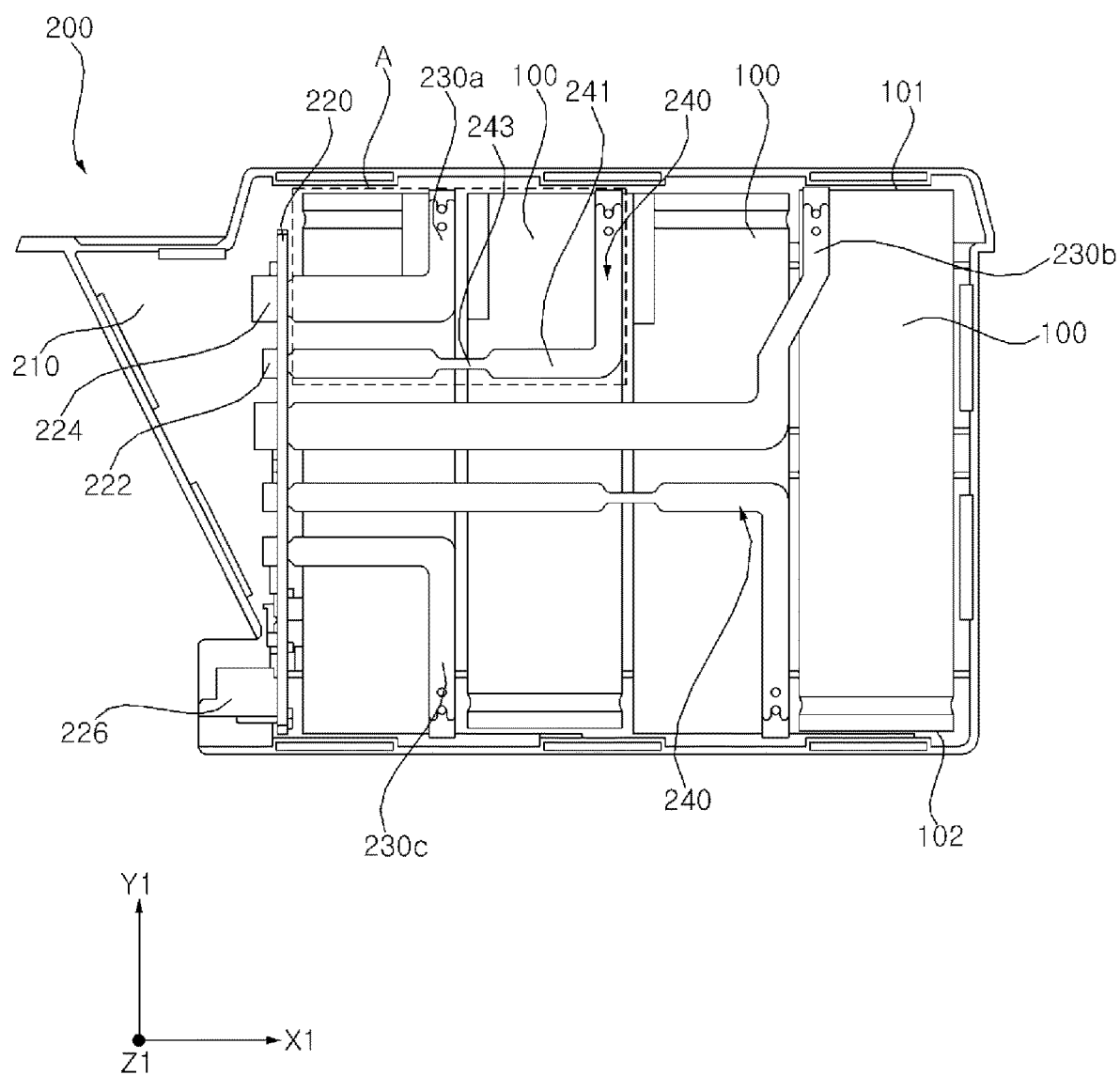
FIG. 7A is a cross-sectional view of a battery pack in which a portion of a case is removed according to an embodiment of the present disclosure.
Figure 7B:
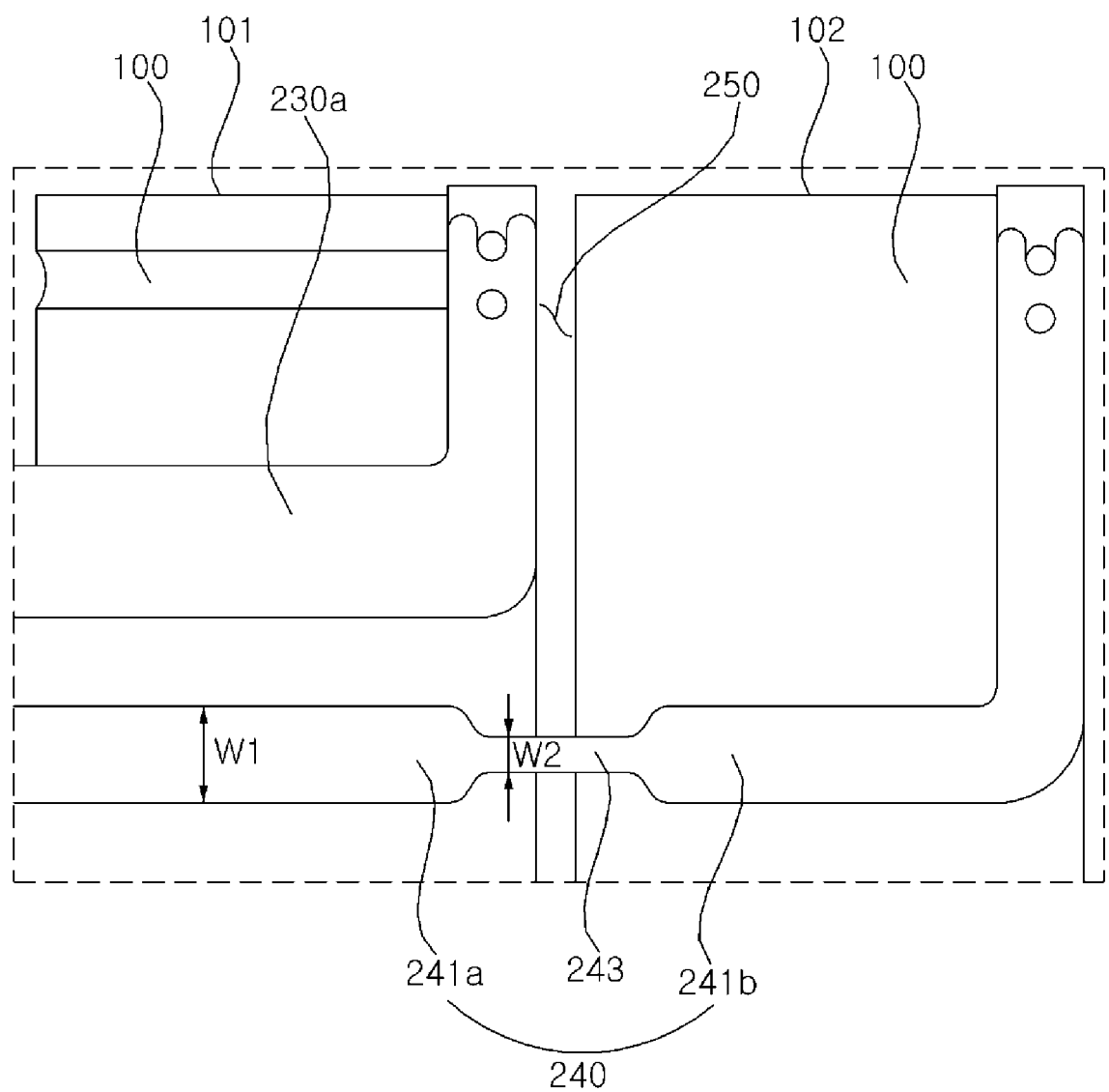
FIG. 7B is an enlarged view of an area A of FIG. 7A.

Hereinafter, a battery pack 200 constituting the above-described battery Bt will be described in detail. Referring to FIGS. 7A and 7B, a battery pack 200 according to an embodiment of the present disclosure includes a plurality of battery cells 100, lead frames 230a, 230b, and 230c, a sensor 222, and a wiring member (or wires) 240. Further, the battery pack 200 may further include a pack housing 210 and a circuit board 220.

The plurality of battery cells 100 are a secondary battery that repeatedly performs charging and discharging, and may be square or circular, but the present disclosure is not limited thereto, and in the present embodiment, the plurality of battery cells 100 are illustrated as a cylindrical lithium ion battery.

The battery cell 100 generates electric energy, a positive electrode 101 is formed at one end thereof, and a negative electrode 102 is formed at the other end thereof. Each battery cell 100 is long disposed in a direction parallel to a width direction Y1 of the wiring member 240, and the plurality of battery cells 100 are disposed along a length direction X1 of the wiring member 240. A detailed configuration of the battery cell 100 will be described in FIG. 9 and the subsequent drawings.

The lead frames 230a, 230b, and 230c connect a plurality of battery cells 100 in series or in parallel. The lead frame connects the plurality of battery cells 100 and a power supply unit (or power supply controller) 224. Here, the power supply unit 224 is formed in the circuit board 220 to balance electricity generated in the plurality of battery cells 100 and prevents one battery cell 100 from being over-discharged or over-charged.

The lead frames 230a, 230b, and 230c may be disposed to cover the battery cell 100. The lead frames 230a, 230b, and 230c include a connection tab (not illustrated) for connecting electrodes of each battery cell 100 and a main frame for connecting the power supply unit 224 and electrodes of the battery cell 100. The main frame is disposed to cover a part of the battery cell 100. That is, the main frame is disposed over the battery cell 100. Here, the term "over" means a direction orthogonal to a width direction of the wiring member 240 and a length direction of the wiring member 240.

The sensor 222 measures a status of at least one of the plurality of battery cells 100. The sensor 222 is a device that measures a state of the battery cell 100, such as a voltage and current of each battery cell 100. State information of the battery cell 100 is utilized for control of the battery cell 100. The sensor 222 is installed in the circuit board 220. The circuit board 220 is provided with the sensor 222 and the power supply unit 224, and a main terminal 226 connected to an external power supply is installed in the circuit board 220.

The pack housing 210 receives a plurality of battery cells 100, lead frames 230a, 230b, and 230c, sensors 222, and wiring members 240. The pack housing 210 protects an internal configuration from an external impact, static electricity, and moisture, and fixes a plurality of battery cells 100.

Wiring Member 240 of the First Embodiment

The wiring member 240 electrically connects the sensor 222 and at least one of the plurality of battery cells 100. Most of the wiring member 240 has a plate shape parallel to a plane defined by a width direction Y1 and a length direction X1 in order to reduce a length of the battery pack 200, and is disposed over Z1 the battery cell 100. A part of the wiring member 240 may have a plate shape crossing a plane defined by the width direction Y1 and the length direction X1 for connection with the electrode of the battery cell 100.

The wiring member 240 transfers information of the battery cell 100 through electricity, and when an overcurrent flows through the wiring member 240, the circuit board 220, the sensor 222, and the battery pack 200 are damaged. Further, when a separate fuse or fuse circuit is installed to prevent an overcurrent occurring in the wiring member 240, there is a problem that a cost increases and a volume of the battery pack 200 increases.

In order to solve such problems, the present disclosure has a structure of the wiring member 240 that is very simple and enables the wiring member 240 to transmit signals and simultaneously serve as a fuse at low cost. For example, because a width (or, alternatively, a cross-section area or gauge) of a partial area of the wiring member 240 of the present disclosure is smaller than that of another partial area of the wiring member 240, when an overcurrent occurs in a portion having a smaller width (or smaller gauge), a heat is generated due to high resistance, and the portion is disconnected due to overheating such that the section melts and a current break in the wiring member 240 is formed.

Specifically, the wiring member 240 may include a first segment and a second segment having a resistance greater than that of the first segment. For example, the wiring member 240 may include a wiring portion (or first segment) 241 and a fuse portion (or second segment) 243 having a width (or gauge) smaller than that of the wiring portion 241. In another example, the fuse portion 243 may have a thickness (e.g., in the z direction) that is smaller than that of the wiring portion 241. As used herein, a width or thickness of wiring portion 241 and fuse portion 243 may be evaluated orthogonal to a direction of current flow.

Here, a location of the fuse portion 243 may be located in an area other than one end of the wiring member 240 or both ends of the wiring member 240. More specifically, the wiring portion 241 may include a first wiring portion 241a and a second wiring portion 241b, and the fuse portion 243 may be located between the first wiring portion 241a and the second wiring portion 241b to connect the first wiring portion 241a and the second wiring portion 241b. One end of the first wiring portion 241a may be connected to the sensor 222, and one end of the second wiring portion 241b may be connected to an electrode of the battery cell 100.

In this case, because the fuse portion 243 is a portion that is disconnected due to overheating during an overcurrent, the fuse portion 243 should be disposed to minimize damage to the adjacent battery cells 100 due to the disconnection thereof. Accordingly, at least a portion of the fuse portion 243 may be disposed to overlap an area 250 between the battery cells 100 adjacent to each other. Specifically, at least a portion of the fuse portion 243 may be disposed to overlap in the vertical direction Z1 with the area 250 between the battery cells 100 adjacent to each other.

In this case, the battery cells 100 adjacent to each other may be separated from each other or may be in contact with each other. When the battery cells 100 adjacent to each other contact each other, the area 250 between the battery cells 100 adjacent to each other means an area where the adjacent battery cells 100 contact each other.

When the fuse portion 243 is located to overlap in the area 250 between the adjacent battery cells 100, even though the fuse portion 243 is disconnected, the heated fuse portion 243 falls into the area 250 between the adjacent battery cells 100, thereby reducing the possibility of damage to the battery cell 100. Here, the battery cell 100 may be extended in a first direction Y1, and the fuse portion 243 may be extended in a second direction X1 crossing the first direction. That is, the battery cell 100 has a length in the first direction Y1, and the fuse portion 243 has a length in the second direction X1. The fuse portion 243 may be extended in a direction parallel to the length direction of the wiring member 240.

When a second width W2, e.g., a length in the direction Y1, (or second gauge) of the fuse portion 243 is smaller than a first width (or first gauge) of the wiring portion 241, there is no limitation. However, when the width W2 (or gauge) of the fuse portion 243 is too large, the fuse portion 243 cannot function as a fuse because the fuse portion 243 is not disconnected even when an overcurrent flows, and when the width W2 (or gauge) of the fuse portion 243 is too small, there is a problem that the fuse portion 243 is disconnected due to high resistance before an overcurrent flows. While the wiring portion 241 and the fuse portion 243 are shown as having uniform widths, it should be appreciated that respective widths of the wiring portions 241 and fuse portion 243 may vary in different regions, and the widths W1 and W2 may correspond to smallest respective widths of the wiring portions 241 and fuse portion 243.

Accordingly, in the present disclosure, in order to solve such problems, it is preferable that the width W2 (or cross-section area) of the fuse portion 243 is 10% to 20% of the width W1 (or cross-section area) of the wiring portion 241 when the wiring portion 241 and the fuse portion 243 have similar thicknesses. More preferably, the width W2 of the fuse portion 243 may be 0.05 mm to 0.12 mm.

The fuse portion 243 may have a plate shape and define a plane parallel to a plane defined by the width direction Y1 and the length direction X1. This is to reduce a volume of the battery pack 200 when assembled to the pack housing 210. The thickness of the fuse portion 243 (the length in the vertical direction Z1) is not limited. However, when the thickness of the fuse portion 243 is too large, even if an overcurrent flows, the fuse portion 243 cannot function because it is not disconnected, it is difficult to manufacture the wiring member, a volume of the battery pack 200 increases, and when the thickness of the fuse portion 243 is too small, there is a problem that the fuse portion 243 is disconnected due to high resistance before an overcurrent flows. Therefore, the thickness of the fuse portion 243 is the same as that of the wiring portion 241, and it is advantageous to adjust the width W2 of the fuse portion 243 in consideration of cost reduction, production difficulty, and the volume of the battery pack 200.

The length of the fuse portion 243 is not limited. However, when the length of the fuse portion 243 is too large, the fuse portion 243 may be easily disconnected due to high resistance before an overcurrent flows, and the disconnected portion may be too long to cause damage to the battery cell 100 when disconnected, and when the length of the fuse portion 243 is too small, there is a problem that the fuse portion 243 cannot function because the fuse portion 243 is not disconnected even when an overcurrent flows. Therefore, it is preferable that the length of the fuse portion 243 is shorter than that of the wiring portion 241. More preferably, the length of the fuse portion 243 is 10% to 30% of that of the wiring portion 241. As used herein, a length may be measured in a direction of a current flow (e.g., between the sensor 222 and a battery cell 100).

The wiring member 240 is preferably made of a material such as copper, nickel, and aluminum having good electrical conductivity. More preferably, the wiring member 240 may include the same material as that of the cell housing of the battery cell 100. Specifically, the wiring member 240 may include nickel (Ni). When the wiring member 240 includes nickel, a melting point of nickel is low and thus the wiring member 240 may be easily disconnected, and because the melting point thereof is low, damage of other components after disconnection of the fuse portion 243 can be minimized. In another example, wiring member 240 may be fabricated so that the fuse portion 243 is made of a material or a composition of materials that melts at a lower temperature in comparison to the wiring portion 241, such as the fuse portion 243 having a relatively higher concentration of Ni. In this example, the width (or cross-section area) of the fuse portion 243 may correspond to the width (or cross-section area) of the wiring portion 241.

Wiring Member 240 of the Second Embodiment

Hereinafter, the wiring member 240 according to the second embodiment will be described. Compared to the first embodiment, the wiring member 240 of the second embodiment has a difference in a structure of a fuse portion 243A. Hereinafter, a description will be made mainly on differences from the first embodiment, and portions that are not specifically described are regarded as the same as those of the first embodiment.

Figure 8A:
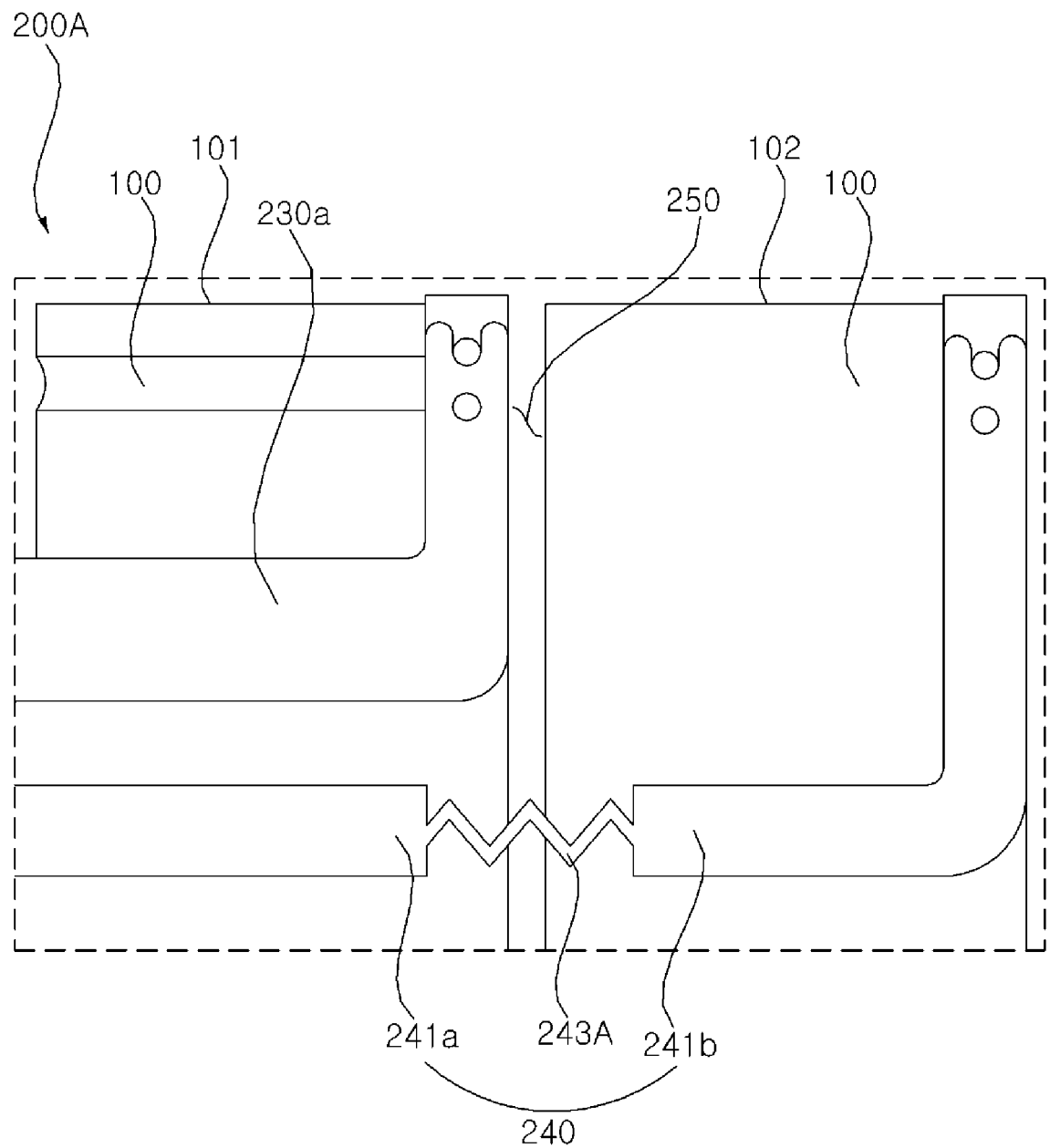
FIG. 8A is a cross-sectional view of a battery pack according to another embodiment of the present disclosure.

Referring to FIG. 8A, the fuse portion 243A of the second embodiment may have a wave shape. The fuse portion 243A may be a combination of various line segments crossing the length direction X1 by 90 degrees or less. The fuse portion 243A may have a zigzag shape. When the fuse portion 243A has a wave shape, the length of the fuse portion 243A increases, so that disconnection thereof may be easily induced, and the length of the fuse portion 243A is small, thereby reducing damage to other components when disconnected.

Wiring Member 240 of the Third Embodiment

Hereinafter, the wiring member 240 according to the third embodiment will be described. Compared to the first embodiment, the wiring member 240 of the third embodiment has a difference in a structure of a fuse portion 243B. Hereinafter, a description will be made mainly on differences from the first embodiment, and portions that are not specifically described are regarded as the same as those of the first embodiment.

Figure 8B:
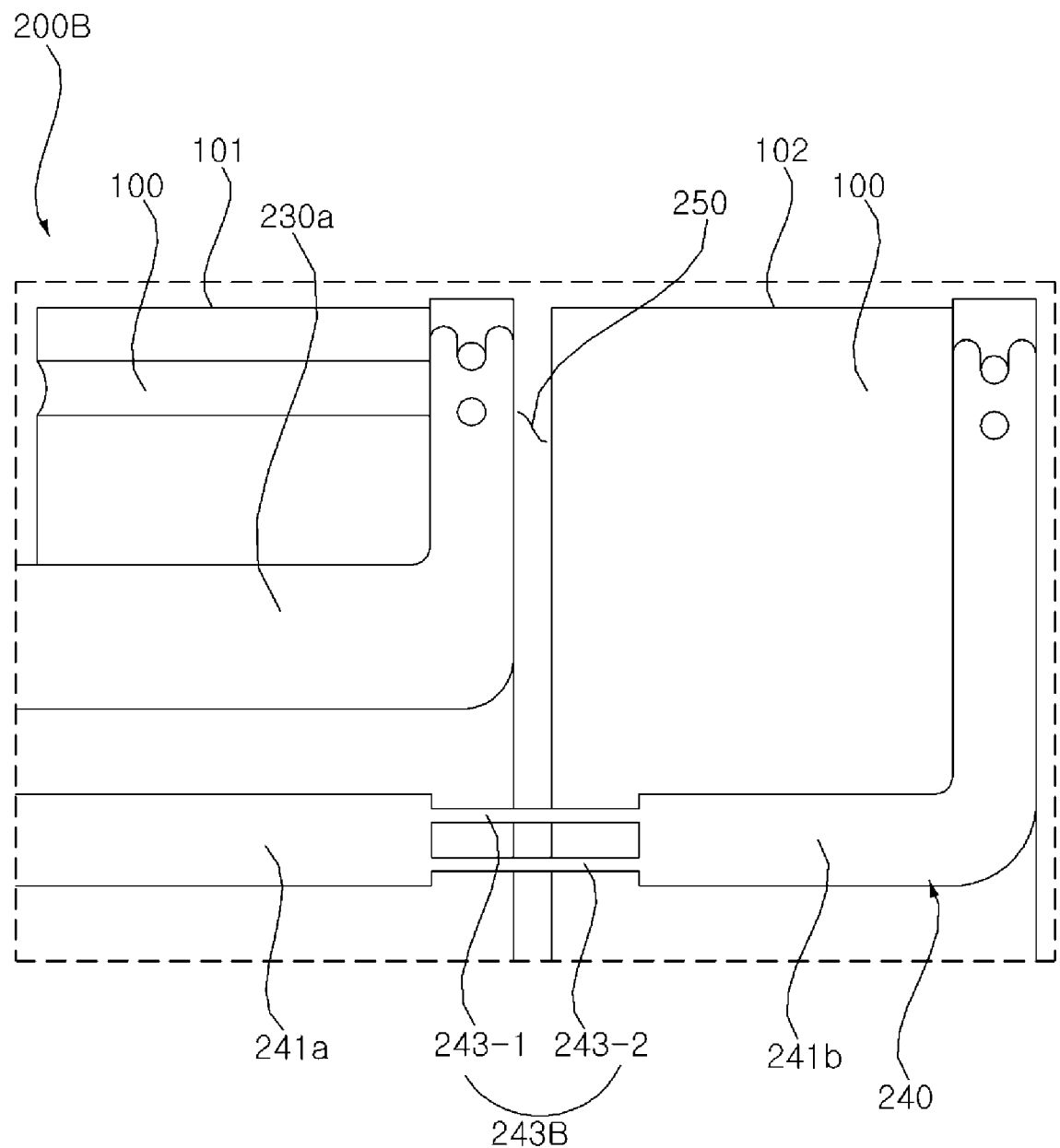
FIG. 8B is a plan view of a battery pack according to another embodiment of the present disclosure.

Referring to FIG. 8B, the fuse portion 243B of the third embodiment is the plural, and the plurality of fuse portions 243B overlap in the width direction Y1 of the wiring member 240, and the sum of widths of the plurality of fuse portions 243B may be smaller than the width W1 of the wiring portion 241. The sum of widths of the plurality of fuse portions 243B is preferably equal to the width W2 of the fuse portion 243B in the first embodiment.

When the plurality of fuse portions 243B are overlapped in the thickness direction, the thickness of the battery pack 200 increases, and there is a risk of disconnection when the pack housing 210 is coupled and thus it is preferable that the plurality of fuse portions 243B overlap in the width direction Y1 of the wiring member 240. In the embodiment, the fuse portion 243B includes a first fuse portion (or first-second segment portion) 243-1 and a second fuse portion (first-second segment portion) 243-2, but the present disclosure is not limited thereto. When a plurality of fuse portions (or second segment portions) 243B are provided, a volume of each fuse portion 243B is small and thus the fuse portion 243B cools quickly upon disconnection, thereby reducing damage to other components due to a heat.

Figure 9A:
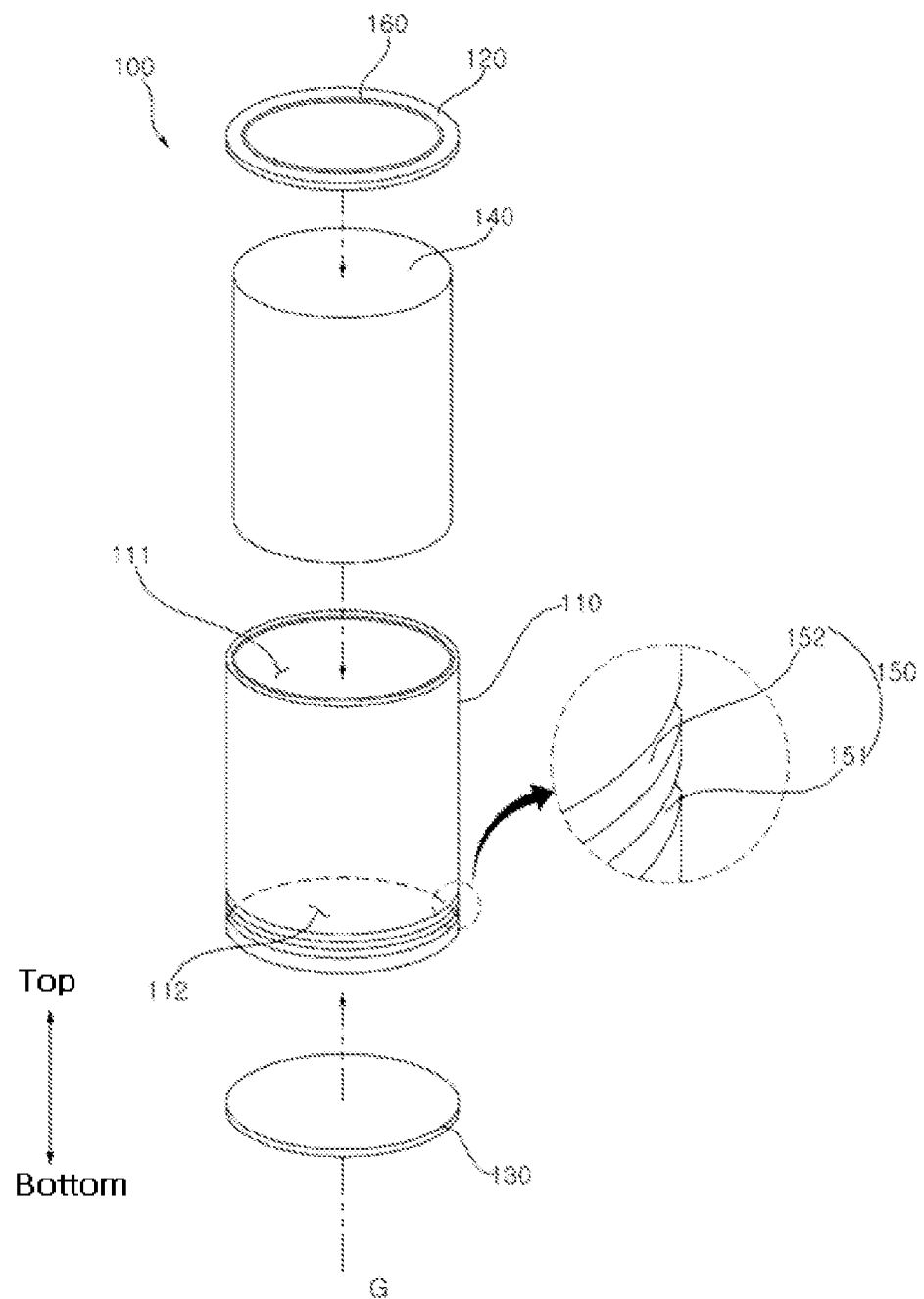
FIG. 9A is an exploded perspective view of a battery cell according to an embodiment of the present disclosure.
Figure 9B:
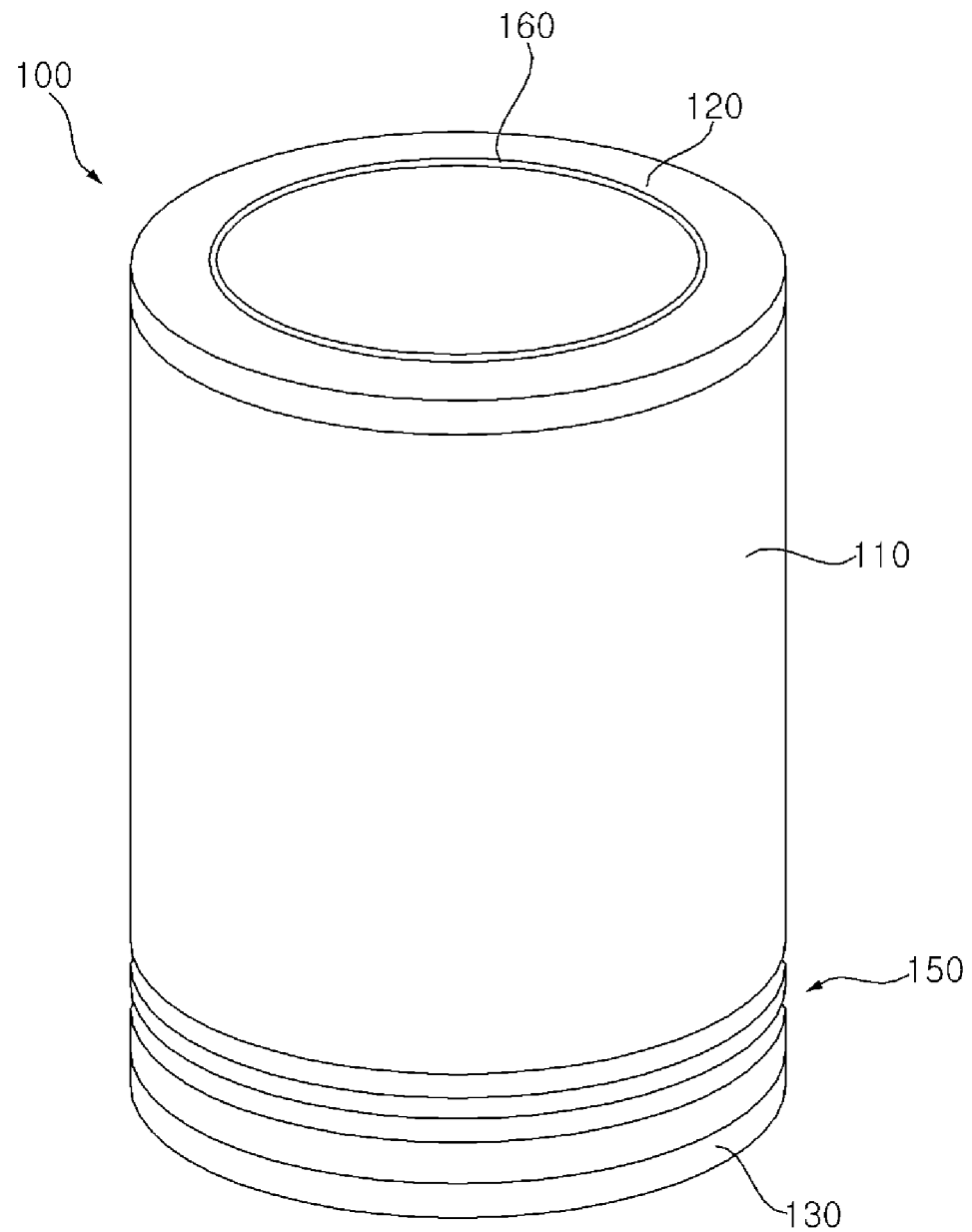
FIG. 9B is a coupled perspective view illustrating the battery cell of FIG. 9A.
Figure 10:
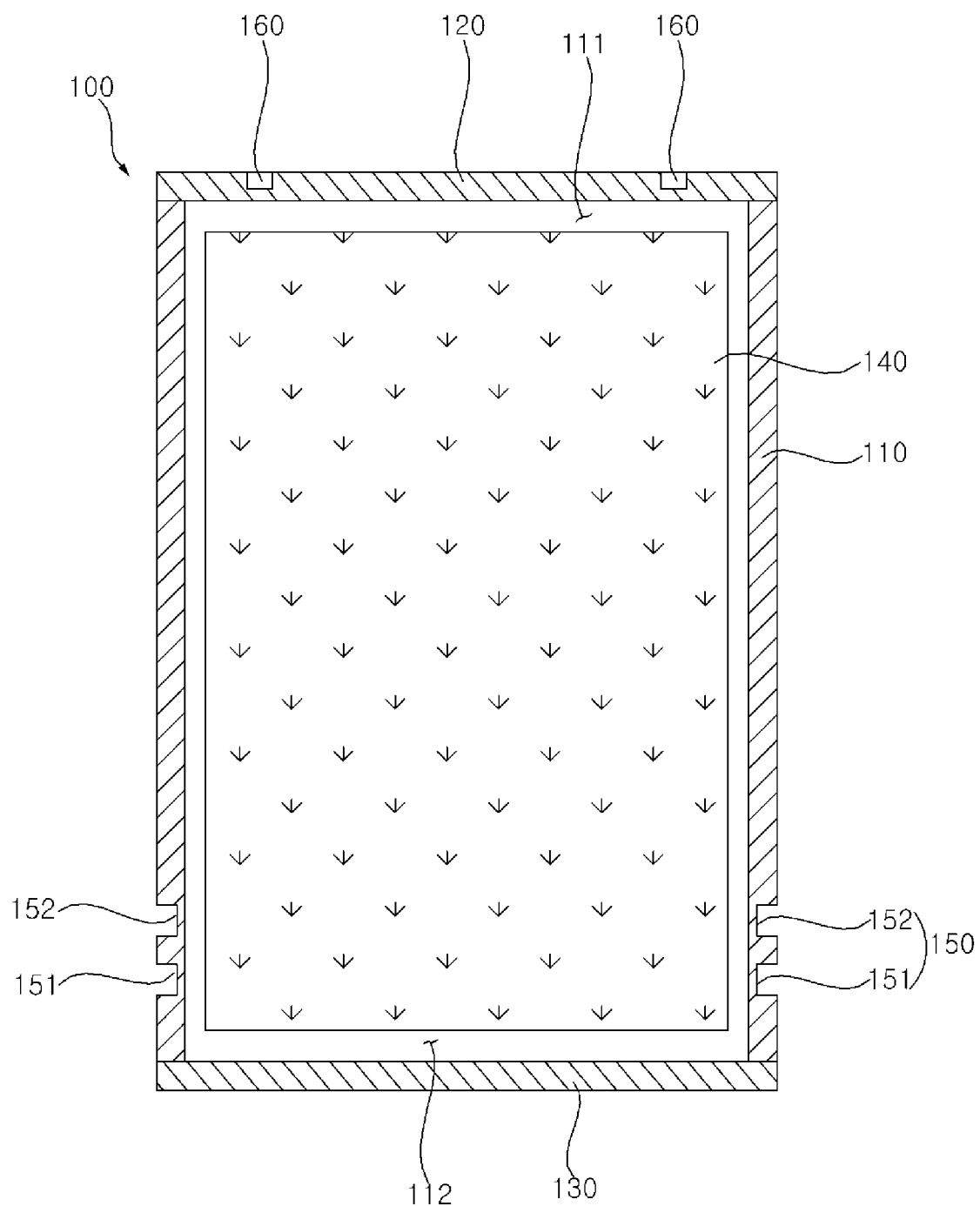
FIG. 10 is a vertical cross-sectional view of the battery cell of FIG. 9B.

Hereinafter, a battery cell 100 constituting the above-described battery Bt will be described in detail. <First Embodiment, Battery Cell> Referring to FIGS. 9 and 10, the battery cell 100 of the present disclosure includes a core material 140 for providing electrical energy and cell housings 110, 120, and 130 for receiving the core material 140.

The core material 140 provides electrical energy while discharging. For example, the core material 140 includes a positive electrode plate, a negative electrode plate, and a separator, and an electrode lead may be connected to an electrode tab extended from each of the positive electrode plate and the negative electrode plate.

The cell housings 110, 120, and 130 provide a space for receiving the core material 140, and power terminals connected to the positive electrode plate and the negative electrode plate are formed. The cell housings 110, 120, and 130 may have various shapes receiving the core material 140.

For example, the cell housings 110, 120, and 130 may have various shapes such as a cylinder, a polyprism, and a pouch shape. Specifically, the cell housings 110, 120, and 130 may include a side cover 110 opened in a vertical direction and for enclosing a housing shaft G, an upper cover 120 for shielding an upper opening of the side housing, and a lower cover 130 for shielding a lower opening of the side housing.

The side cover 110 has a cylindrical shape centered on the housing shaft G, and has an upper opening 111 and a lower opening 112. The side cover 110 may have a surface extended in a direction parallel to the housing shaft G.

The upper cover 120 covers the upper opening 111. The upper cover 120 may define a surface crossing the housing axis G. An electrode terminal (not illustrated) may be formed in the upper cover 120. Preferably, in the upper cover 120, the electrode terminal may not be formed, and an upper vent groove 160 may be formed.

The upper vent groove 160 has a structure in which a part of the upper cover is damaged when a pressure increases due to the exhaust gas inside the cell housings 110, 120, and 130. For example, the upper vent groove 160 may be formed by recessing a part of the upper cover. For another example, the upper vent groove 160 may be defined as an area having a thickness smaller than that of the upper cover in the upper cover.

A cross-sectional shape of the upper vent groove 160 may be a V or U shape. The upper vent groove 160 may be extended in one direction in a line shape. The upper vent groove 160 is preferably formed in a ring shape enclosing the housing shaft G.

The lower cover 130 covers the lower opening 112. The lower cover 130 may define a surface crossing the housing axis G. An electrode terminal (not illustrated) may be formed in the lower cover 130. Preferably, a positive terminal (not illustrated) connected to the positive electrode plate and a negative electrode terminal (not illustrated) connected to the negative electrode plate may be formed in the lower cover 130.

Because the lower cover 130 and the lead frame are connected to each other by welding, when a vent groove is formed in the lower cover 130, while the vent groove is damaged during a welding process, the battery cell 100 may be damaged. Accordingly, the present disclosure solves such problems by forming a vent groove in the side cover 110, as described later without forming a vent groove in the lower cover 130.

Side vent grooves 150 are formed in the side cover 110. The side vent grooves 150 may have a structure to be damaged when a pressure inside the cell housings 110, 120, and 130 exceeds a preset pressure. Further, the side vent groove 150 may have a structure that is damaged and deformed when a pressure inside the cell housings 110, 120, and 130 exceeds a preset pressure to guide a discharge direction of the exhaust gas discharged from the inside of the cell housings 110, 120, and 130.

For example, the side vent groove 150 may be formed by recessing a part of the side cover 110. For another example, the side vent groove 150 may be defined as an area having a thickness smaller than that of the side cover 110 in the side cover 110. That is, a portion of the side cover 110 having a smaller thickness than a reference thickness may be defined as the side vent groove 150. The side vent groove 150 has a thickness smaller than that of the side cover 110. It is easy to produce that the side vent groove 150 is made of the same material as that of the side cover 110.

A cross-sectional shape of the side vent groove 150 may be a V or U shape. The side vent groove 150 may be extended in one direction in a line shape. Further, the side vent groove 150 may have a shape in which a plurality of straight lines are connected to each other or may have a circular shape. Further, the side vent groove 150 may be connected continuously. Further, a plurality of side vent grooves 150 may be disposed to be spaced apart from each other.

For example, the side vent groove 150 is formed in a ring shape enclosing the housing shaft G. The side vent groove 150 defines a closed curve enclosing the housing axis G. Specifically, the side vent groove 150 is extended along the circumference of the side cover 110. While the side vent groove 150 is extended along the circumference of the side cover 110, the side vent groove 150 may have a disconnected portion in the middle. The side vent groove 150 may be extended in a direction parallel to that of the lower cover 130.

For another example, the side vent groove 150 may include a first side vent groove 151 extended in a direction parallel to that of the lower cover 130 and a second side vent groove 152 extended in a direction parallel to that of the lower cover 130 and spaced upward from the first side vent groove 151. The first side vent groove 151 and the second side vent groove 152 may define a closed curve enclosing the housing axis G. As another example, the side vent groove 150 may be a plurality of lines extended in a direction parallel to the lower cover 130.

When the side vent groove 150 is formed along the circumference of the side cover 110, the vent groove may be formed in a larger area than that of the lower cover 130 and thus it is possible to lower a pressure of the exhaust gas discharged from the cell housings 110, 120, and 130 and to reduce damage to components other than the battery due to the pressure of the exhaust gas.

The side vent groove 150 is disposed to be biased toward the lower cover 130 in the side cover 110. For example, it is preferable that a distance between the side vent groove 150 and the lower cover 130 is 0.5 mm to 2 mm. When the side vent groove 150 is disposed to be biased toward the lower cover 130, a movement of the battery cell 100 may be prevented by balance between the exhaust gas discharged from the upper vent groove 160 of the upper cover 120 and the exhaust gas discharged from the side vent groove 150.

Figure 11:
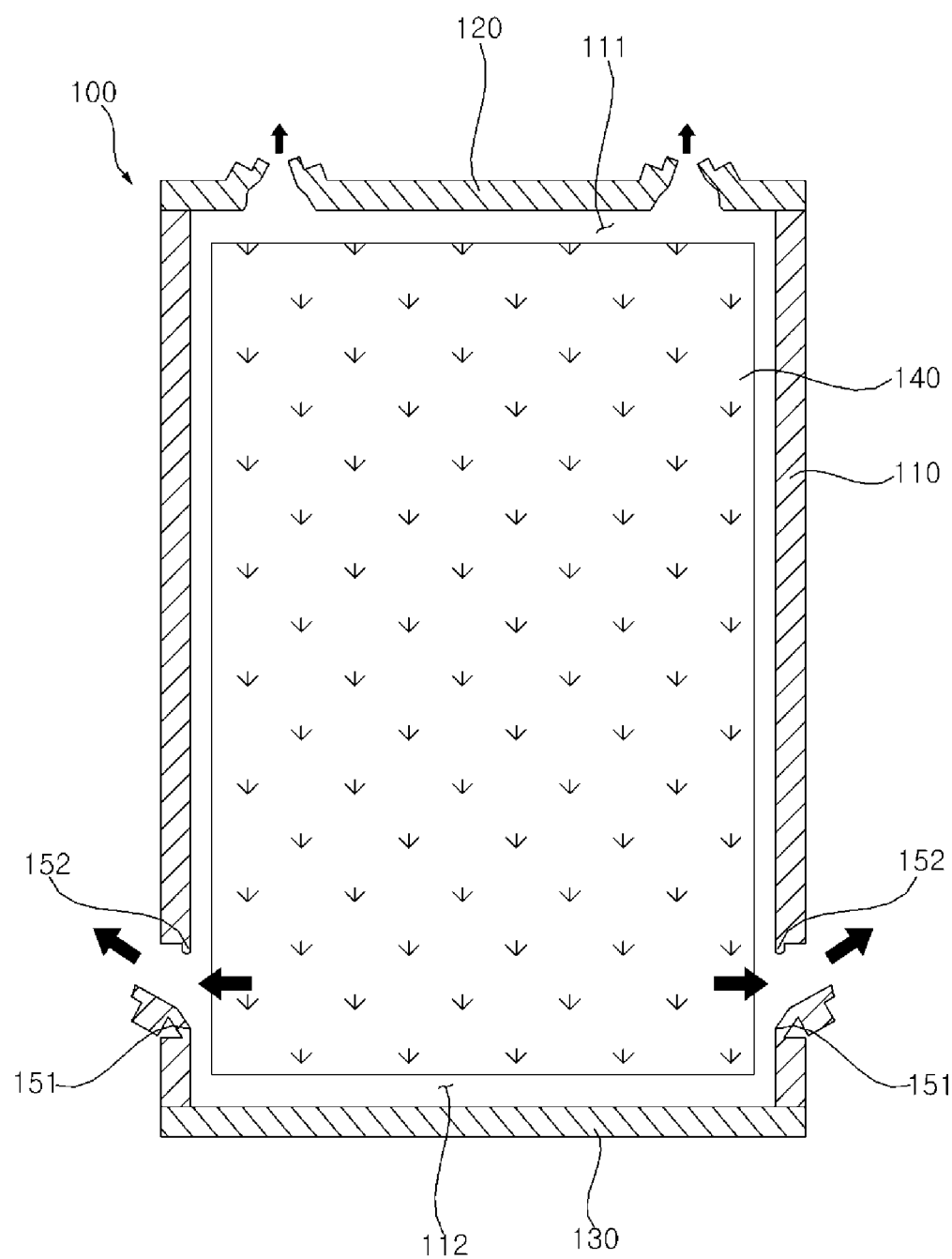
FIG. 11 is a diagram illustrating an operation when a gas is discharged from the battery cell of FIG. 10.

Referring to FIG. 11, when a gas is excessively generated in the cell housings 110, 120, and 130 due to a cause such as overcharging or an internal short circuit and a pressure thus increases, while the side vent groove 150 is damaged, a space communicating the inside of the cell housings 110, 120, and 130 and the outside is formed. When an exhaust gas inside the cell housings 110, 120, and 130 is ejected through the space, explosion of the battery cell 100 is prevented. Although not illustrated in the drawings, while the upper vent groove 160 is also damaged, a gas is discharged into the damaged space.

Second Embodiment

Hereinafter, a battery cell 100A according to the second embodiment will be described. Hereinafter, a description will be made mainly on differences from the first embodiment (FIGS. 9 and 10), and the same description will be omitted. Configurations without special description are regarded as the same as those in the first embodiment.

Figure 12:
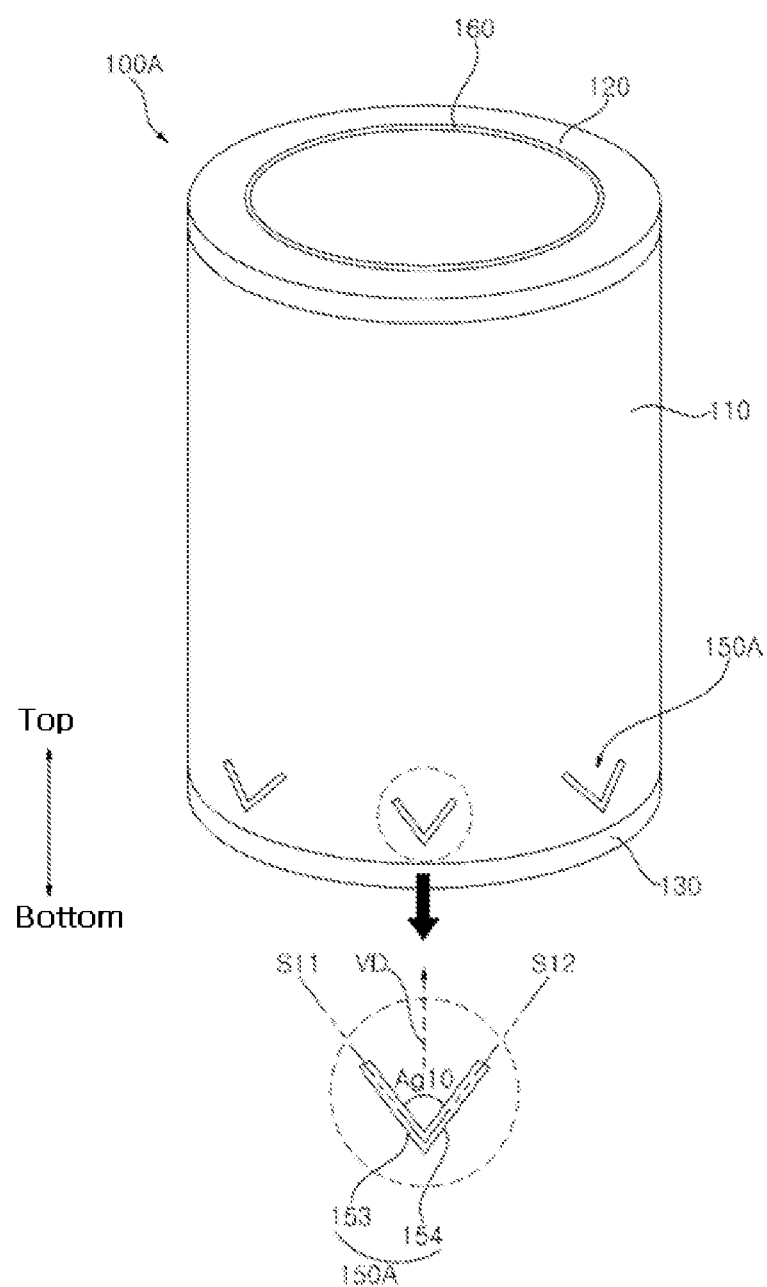
FIG. 12 is a perspective view of a battery cell according to another embodiment of the present disclosure.
Figure 13:
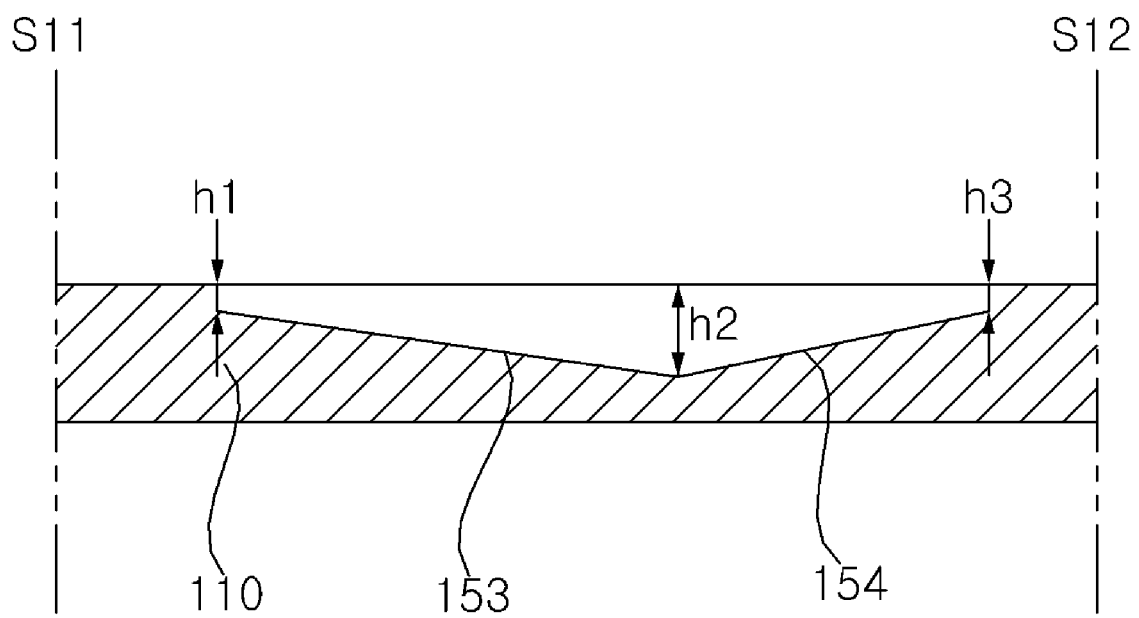
FIG. 13 is a cross-sectional view taken along line S11-S12 of FIG. 12.

Referring to FIGS. 12 and 13, the second embodiment differs from the first embodiment in a structure of a side vent groove 150A. While the side vent groove 150A according to the second embodiment is damaged by a pressure inside the cell housings 110, 120, and 130, the side cover 110 around the side vent groove 150A is deformed and thus the side cover 110 may have a structure that guides a discharge direction of the exhaust gas.

A plurality of side vent grooves 150A may be disposed to be spaced apart from each other. Specifically, a plurality of side vent grooves 150A may be disposed along a circumference of the side cover 110. For example, the side vent groove 150A may include a first open vent groove 153 extended in a first direction and a second open vent groove 154 extended in a second direction and connected to one end of the first open vent groove 153. One end of the first open vent groove 153 is connected to one end of the second open vent groove 154. The first open vent groove 153 and the second open vent groove 154 may have a straight or curved shape.

One end of the first open vent groove 153 and one end of the second open vent groove 154 are connected to each other, and a distance between the first open vent groove 153 and the second open vent groove 154 may increase as advancing in a direction from one end to the other end of the first open vent grooves 153. The first direction and the second direction may be a direction between an upper part and a lateral direction.

An angle Ag10 formed between the first open vent groove 153 and the second open vent groove 154 may be an acute angle. Preferably, the angle Ag10 formed between the first open vent groove 153 and the second open vent groove 154 may be 20 degrees to 40 degrees. The first open vent groove 153 and the second open vent groove 154 have a V-shape. When the side cover 110 is cut along the first open vent groove 153 and the second open vent groove 154, a large space for discharging exhaust gas may be secured, so that a pressure of the exhaust gas becomes very low, and an amount of exhaust gas that may be discharged per hour increases.

A distance between the first open vent groove 153 and the second open vent groove 154 may increase as advancing in an upward direction. When the angle Ag10 between the first open vent groove 153 and the second open vent groove 154 is smaller than 20 degrees, when the side cover 110 is cut by the exhaust gas, a space in which exhaust gas is sufficiently discharged is not secured, and when the angle Ag10 between the first open vent groove 153 and the second open vent groove 154 is greater than 40 degrees, it is difficult for the side cover 110 to be cut along the first open vent groove 153 the second open vent groove 154 by the exhaust gas and it is difficult for the side cover 110 to be deformed.

A direction VD of an angle between the first open vent groove 153 and the second open vent groove 154 may form an angle within 45 degrees from an upward direction. Preferably, the direction VD of the angle between the first open vent groove 153 and the second open vent groove 154 may be parallel to the upward direction. When the direction VD of the angle between the first open vent groove 153 and the second open vent groove 154 is parallel to an upward direction, the side cover 110 is cut along the first open vent groove 153 and the second open vent groove 154 by the exhaust gas to guide the exhaust gas in a direction between the lower side and the side. When the exhaust gas is discharged between the lower side and the side, the sum of vectors of the exhaust gas discharged from the upper vent groove 160 is close to zero and thus the battery cell 100A is prevented from being discharged.

A depth h2 of one end of the first open vent groove 153 may be greater than a depth h1 of the other end of the first open vent groove 153, and a depth h2 of one end of the second open vent groove 154 may be greater than a depth h3 of the other end of the second open vent groove 154. As another example, a depth of the first open vent groove 153 may increase as advancing in a direction from the other end toward one end, and a depth of the second open vent groove 154 may increase as advancing in a direction from the other end toward one end.

When a depth of a portion where the first open vent groove 153 and the second open vent groove 154 are connected is deep, while the damage is started from one end of the first open vent groove 153 and one end of the second open vent groove 154 by exhaust gas, and the damage proceeds in a direction of the other end of the first open vent groove 153 and the other end of the second open vent groove 154, the side cover 110 between the first open vent groove 153 and the second open vent groove 154 is bent.

Figure 14:
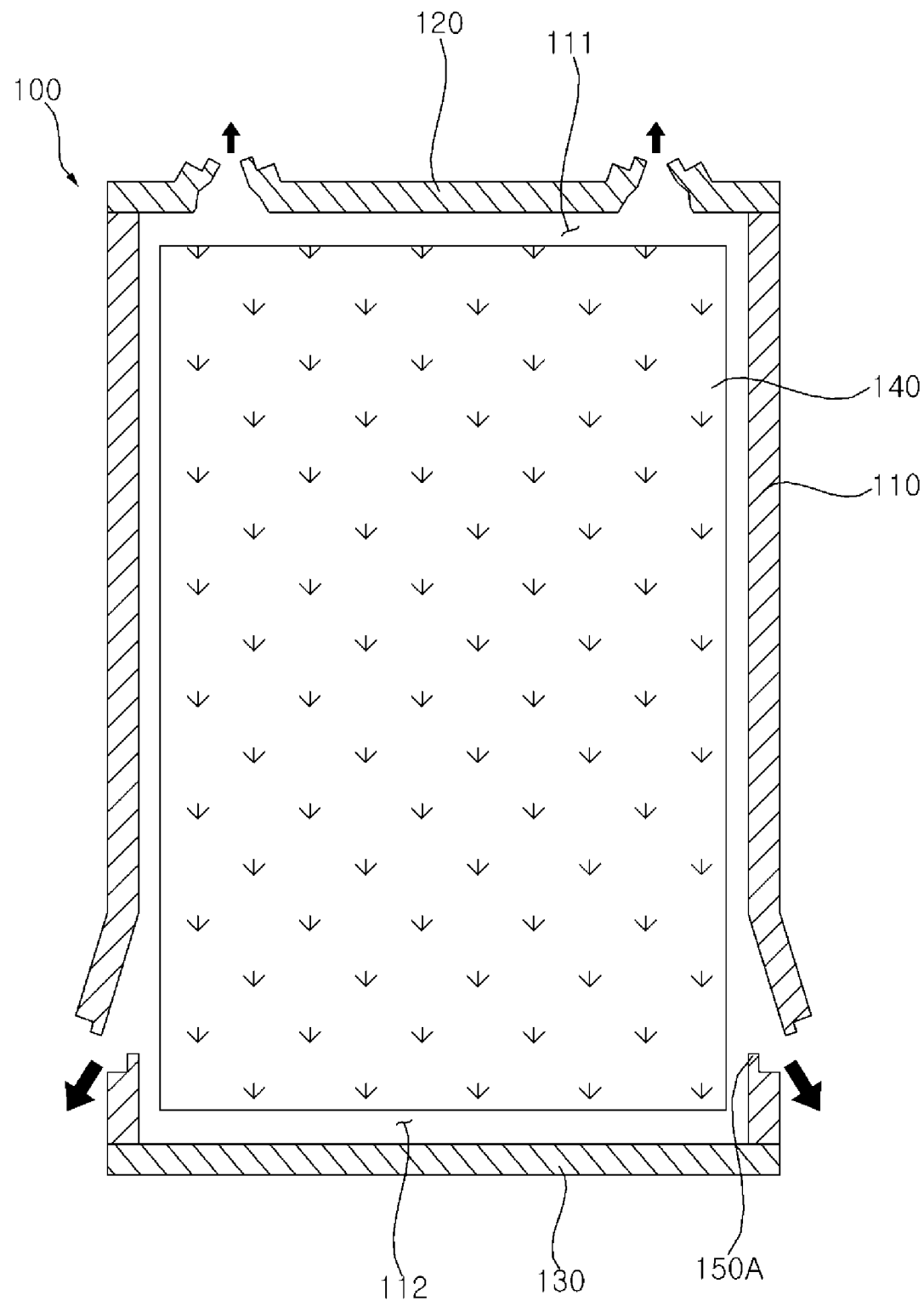
FIG. 14 is a diagram illustrating an operation when a gas is discharged from the battery cell of FIG. 12.

Referring to FIG. 14, when a gas is excessively generated in the cell housings 110, 120, and 130 due to a cause such as overcharging or an internal short and a pressure thus increases, while the damage is started from one end of the first open vent groove 153 and one end of the second open vent groove 154 and the damage proceeds in a direction of the other end of the first open vent groove 153 and the other end of the second open vent groove 154, the side cover 110 between the first open vent groove 153 and the second open vent groove 154 is bent, and the side cover 110 is opened. When an exhaust gas is ejected into the open space of the side cover 110, an exhaust gas discharge direction is guided between an outer direction and a lower direction by the bent portion of the side cover 110.

Third Embodiment

Hereinafter, a battery cell 100B according to the third embodiment will be described. Hereinafter, a description will be made mainly on differences from the second embodiment (FIGS. 12 and 13), and the same description will be omitted. Configurations without special description are regarded as the same as those in the second embodiment.

Figure 15:
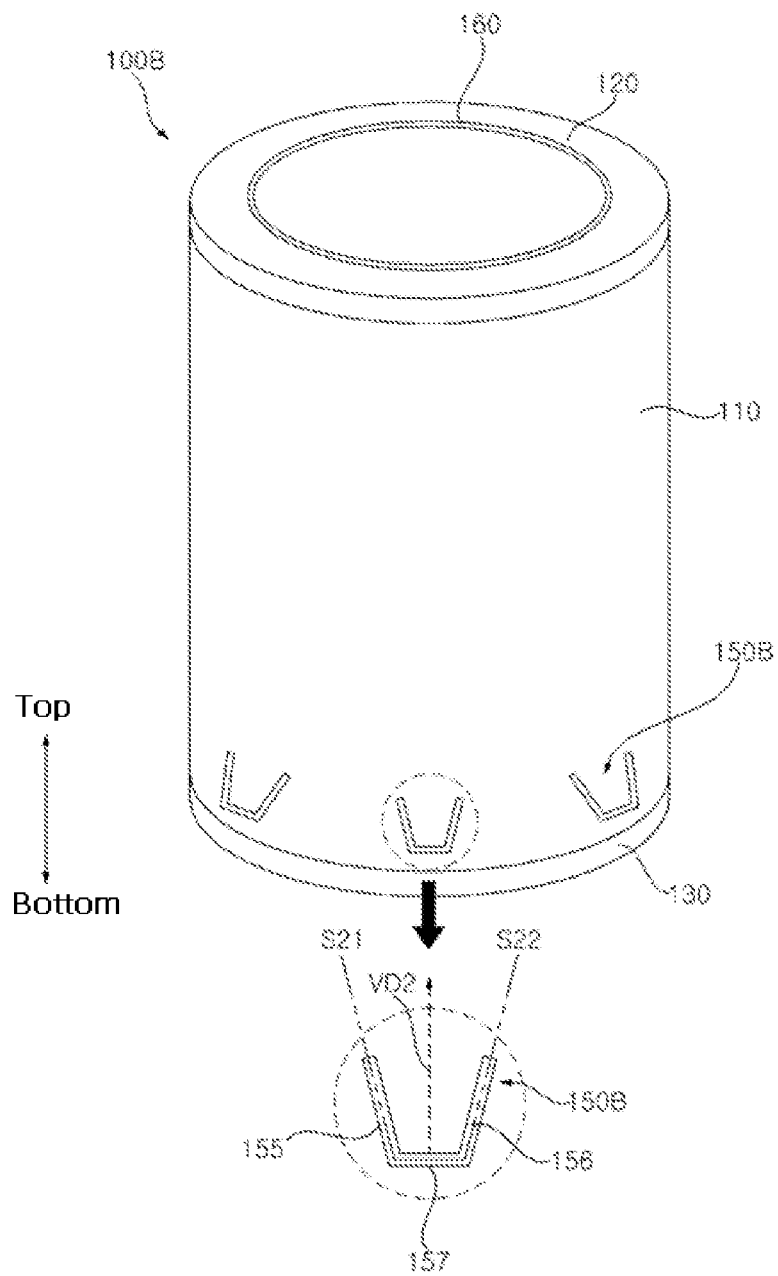
FIG. 15 is a perspective view of a battery cell according to another embodiment of the present disclosure.
Figure 16:
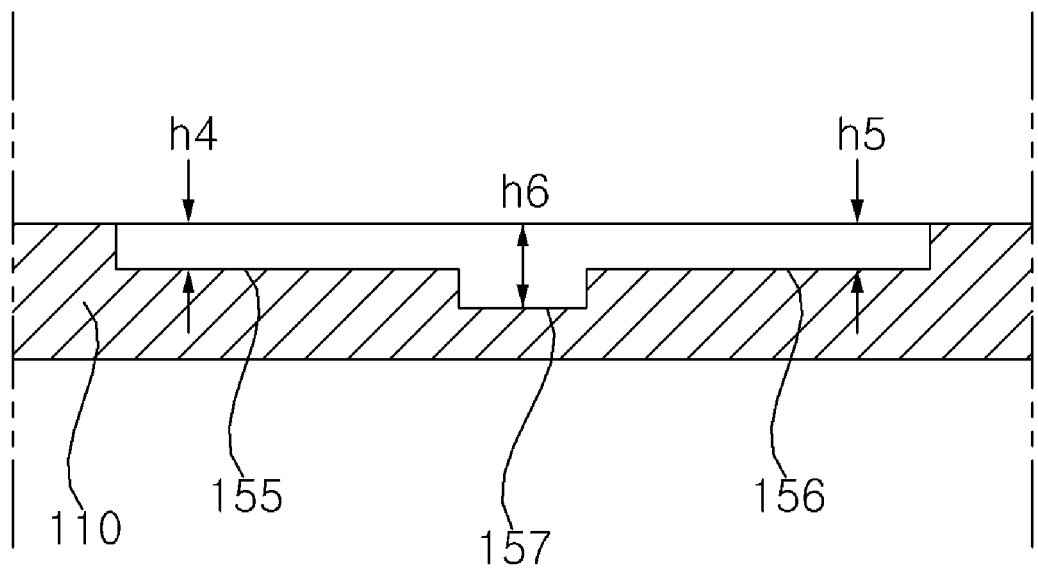
FIG. 16 is a cross-sectional view taken along line S21-S22 of FIG. 15.

Referring to FIGS. 15 and 16, the third embodiment differs from the second embodiment in a structure of a side vent groove 150B. While the side vent groove 150B according to the third embodiment is damaged by a pressure inside the cell housings 110, 120, and 130, the side cover 110 around the side vent groove 150S is deformed and thus the side cover 110 may have a structure that guides a discharge direction of the exhaust gas.

For example, the side vent groove 150S includes a first open vent groove 155 extended in a first direction, a second open vent groove 156 extended in a second direction and connected to one end of the first open vent groove 155, and a third open vent groove 157 for connecting one end of the first open vent groove 155 and one end of the second open vent groove 156.

One end of the first open vent groove 155 and one end of the second open vent groove 156 are connected to both ends of the third open vent groove 157. The third open vent groove 157 may be extended in a direction crossing a vertical direction. Preferably, the third open vent groove 157 may be extended in a direction parallel to that of the lower cover 130.

A distance between the first open vent groove 155 and the second open vent groove 156 may increase as advancing in a direction of the other end (upper direction) from one end of the first open vent groove 155. An angle between the first open vent groove 155 and the second open vent groove 156 may be an acute angle. Preferably, the angle between the first open vent groove 155 and the second open vent groove 156 may be 10 to 30 degrees. Initially, because an exhaust gas discharge space is largely secured by the third open vent groove 157, there is no need for a large angle between the first open vent groove 155 and the second open vent groove 156.

A direction VD2 of an angle between the first open vent groove 155 and the second open vent groove 156 may form an angle within 45 degrees from an upward direction. Preferably, the direction VD2 of the angle between the first open vent groove 155 and the second open vent groove 156 may be parallel to the upward direction. When the direction VD2 of the angle between the first open vent groove 155 and the second open vent groove 156 is parallel to the upward direction, the side cover 110 guides the exhaust gas in a direction between the lower side and the side while being cut along the first open vent groove 155 and the second open vent groove 156 by the exhaust gas.

A depth h6 of the third open vent groove 157 may be greater than a depth h4 of the first open vent groove 155 and a depth h5 of the second open vent groove 156. The depth of the first open vent groove 155 and the depth of the second open vent groove 156 may increase as approaching the third open vent groove 157. The depth of the third open vent groove 157 may increase as advancing from both ends toward the center.

When the depth of the third open vent groove 157 is deep, damage is started from the third open vent groove 157 by exhaust gas, while the damage proceeds in a direction of the other end of the first open vent groove 155 and the other end of the second open vent groove 156, the side cover 110 between the first open vent groove 155 and the second open vent groove 156 is bent and opened. According to the third embodiment, an initial large amount of exhaust gas may be discharged, so that the pressure of the exhaust gas may be formed very low initially.

Figure 17:
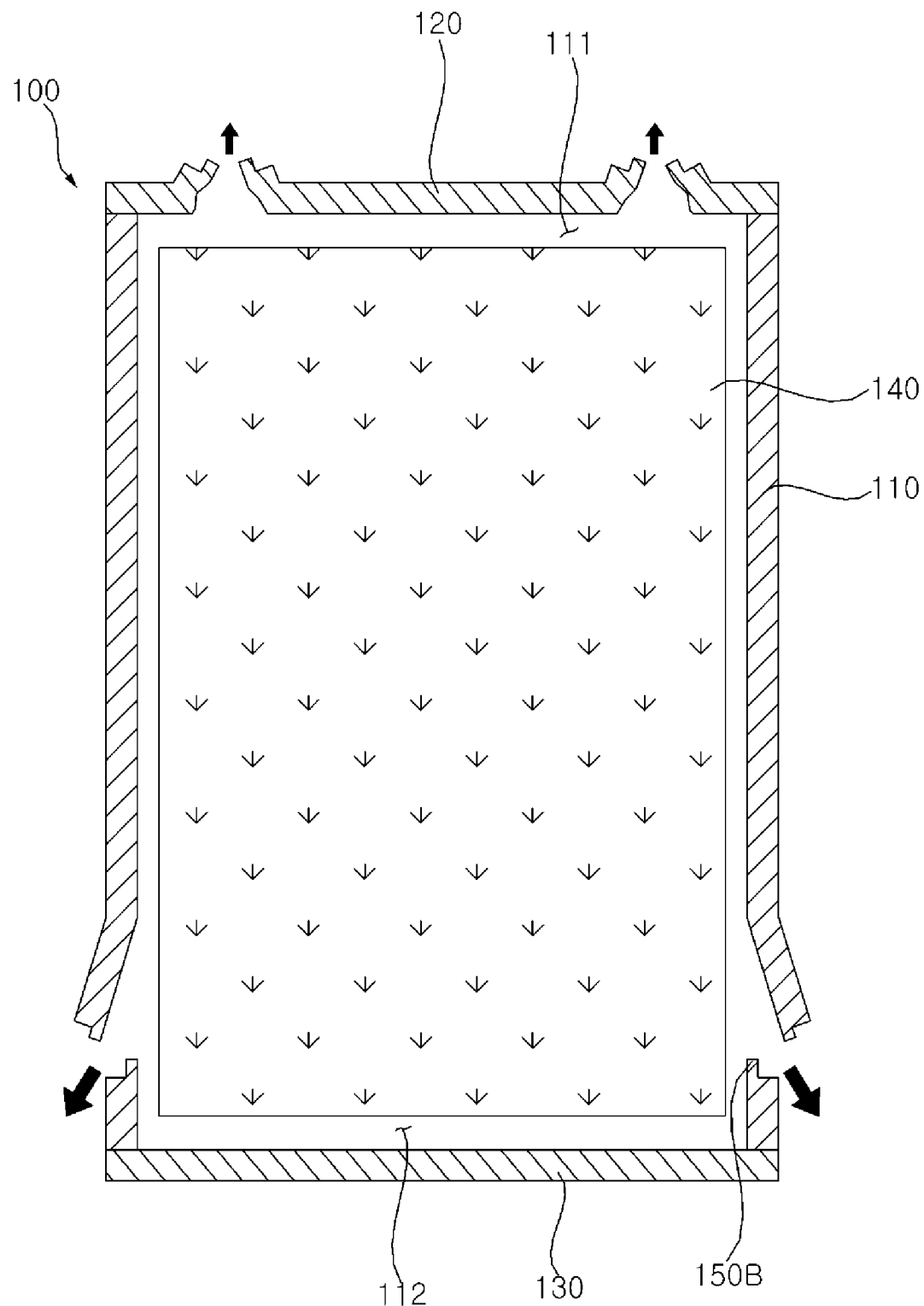
FIG. 17 is a diagram illustrating an operation when a gas is discharged from the battery cell of FIG. 15.

Referring to FIG. 17, when a gas is excessively generated in the cell housings 110, 120, and 130 due to an overcharge or an internal short circuit, and a pressure thus increases, the damage is started from the third open vent groove 157, and while the damage proceeds in a direction of the other end of the first open vent groove 155 and the other end of the second open vent groove 156, the side cover 110 between the first open vent groove 155 and the second open vent groove 156 is bent and opened. When exhaust gas is ejected into the open space of the side cover 110, the exhaust gas discharge direction is guided between an outer direction and a lower direction by the bent portion of the side cover 110.

Through the above solution, aspects of the present disclosure reduce a production cost by changing a structure of a wiring connected to a sensor of a battery pack, and preventing damage to the sensor and a battery cell when an overcurrent occurs. Further, according to the present disclosure, because a sensor wiring of the battery pack is made of nickel, which is easily damaged by an overcurrent, a width of the wiring can be reduced, and a quick disconnection is possible. Further, according to the present disclosure, because a portion of a sensor wiring having a small width is disposed so as to overlap a space between the battery cells, damage to the battery cell can be reduced when the sensor wiring is disconnected.

Further, according to an aspect of the present disclosure, by disposing an exhaust gas discharge structure at the side of the battery cell, even if the exhaust gas is discharged, there is a safety advantage that the battery cell is not discharged from the battery pack. Further, according to an aspect of the present disclosure, even if the battery is overheated, the battery cell is quickly disconnected without damage, so that safe cleaning can be performed without damage to the user. Further, the present disclosure disposes an exhaust gas emission structure at the side of the battery cell, so that even when exhaust gas is discharged, there are advantages that the battery cell is prevented from being discharged from the battery pack and that the risk of damage to components around the battery due to discharge of the battery cell is reduced and that the risk of injury to the user is reduced.

In the foregoing description, preferred embodiments of the present disclosure have been described, but the present disclosure is not limited to the foregoing specific embodiment and can be variously changed by a person of ordinary skill in the art without departing from the scope of the present disclosure claimed in the claims, and such a modified embodiment should not be individually understood from the spirit or scope of the present disclosure.

A first aspect of the present disclosure provides a battery pack that reduces a production cost by changing a structure of a wiring connected to a sensor of a battery pack and that prevents damage to the sensor and a battery cell when an overcurrent occurs.

A second aspect of the present disclosure provides a battery pack capable of reducing a width of a wiring and enabling quick disconnection by using nickel that may be easily damaged by an overcurrent in a sensor wiring of the battery pack. A third aspect of the present disclosure provides a battery pack capable of reducing damage to a battery cell when a sensor wiring is disconnected by disposing a small width portion in the sensor wiring to overlap a space between battery cells.

A fourth aspect of the present disclosure provides a battery cell that is not discharged from a battery pack even when an exhaust gas is discharged by disposing an exhaust gas discharge structure at the side of the battery cell. A fifth aspect of the present disclosure provides a safe cleaner without damage to a user and that is quickly disconnected without damage to a battery cell, even if a battery is overheated.

Accordingly, the present disclosure is characterized in that a width of a part of a wiring member for connecting a sensor and a battery cell is formed smaller than that of another part. In an aspect, a battery pack includes a plurality of battery cells for generating electrical energy; a lead frame for electrically connecting the plurality of battery cells; a sensor for measuring a status of at least one of the plurality of battery cells; and a wiring member for connecting the sensor and at least one of the plurality of battery cells, wherein the wiring member includes a wiring portion; and a fuse portion having a width smaller than that of the wiring portion.

The width of the fuse portion may be 10% to 20% of that of the wiring portion. The width of the fuse portion may be 0.05 mm to 0.12 mm. A thickness of the wiring portion may be the same as that of the fuse portion. A length of the fuse portion may be shorter than that of the wiring portion. A length of the fuse portion may be 10% to 30% of that of the wiring portion.

At least a portion of the fuse portion may be disposed to overlap with an area between the battery cells adjacent to each other. The battery cell may be extended in a first direction, and the fuse portion may be extended in a second direction crossing the first direction.

The fuse portion may be the plural, and the plurality of fuse portions may overlap in a width direction of the wiring member, and the sum of widths of the plurality of fuse portions may be smaller than the width of the wiring portion. The fuse portion may be extended in a direction parallel to a length direction of the wiring member. The fuse portion may have a wave shape.

The wiring portion may include a first wiring portion and a second wiring portion, and the fuse portion may be located between the first wiring portion and the second wiring portion to connect the first wiring portion and the second wiring portion. One end of the first wiring portion may be connected to the sensor, and one end of the second wiring portion may be connected to an electrode of the battery cell. The wiring member may include the same material as that of a cell housing of the battery cell. The wiring member may include nickel (Ni).

The battery pack may further include a circuit board in which the sensor is located. The lead frame may be connected to the circuit board. The battery pack may further include a pack housing for receiving the plurality of battery cells, the lead frame, the sensor, and the wiring member.

The present disclosure may provide a cleaner including the battery pack characterized in that a width of a part of a wiring member for connecting a sensor and a battery cell is formed smaller than that of another part, as previously described.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A battery pack, comprising:
    a plurality of battery cells;
    a lead frame that electrically connects at least two of the plurality of battery cells;
    a sensor that measures a status of one of the plurality of battery cells;
    a circuit board at which the sensor is located; and
    a plurality of wires including a first wire that electrically connects the sensor and the one of the plurality of battery cells, and a second wire that electrically connects the circuit board and another one of the plurality of battery cells,
    wherein each of the first wire and the second wire includes:
        a first segment; and
        a second segment having a cross-section area less than that of the first segment,
    wherein at least a portion of the second segment of the first wire is positioned to overlap a first region between an adjacent first pair of the plurality of battery cells, and at least a portion of the second segment of the second wire is positioned to overlap a second region between an adjacent second pair of the plurality of battery cells, the first pair of the plurality of battery cells and the second pair of the plurality of battery cells being different,
    wherein a width of the second segment in the first direction is less than a width of the first segment in the first direction, and
    wherein a length of the second segment in the second direction is less than a length of the first segment in the second direction.

2. The battery pack of claim 1, wherein the width of the second segment is 10% to 20% of the width of the first segment.

3. The battery pack of claim 1, wherein the width of the second segment is 0.05 mm to 0.12 mm.

4. The battery pack of claim 1, wherein the length of the second segment is 10% to 30% of the length of the first segment.

5. The battery pack of claim 1, wherein at least one of the battery cells extends in a first direction, and the second segment extends in a second direction crossing the first direction.

6. The battery pack of claim 1, wherein the second segment includes a plurality of second segment portions, and
    the plurality of second segment portions overlap in a width direction of the plurality of wires, and a sum of widths of the plurality of second segment portions is less than a first width of the first segment.

7. The battery pack of claim 1, wherein the second segment extends in a direction parallel to a length direction of the plurality of wires.

8. The battery pack of claim 1, wherein the second segment has a wave shape.

9. The battery pack of claim 1, wherein the first segment includes a first wiring portion and a second wiring portion, and
    the second segment is located between the first wiring portion and the second wiring portion to electrically connect the first wiring portion and the second wiring portion.

10. The battery pack of claim 9, wherein one end of the first wiring portion for the first wire is electrically connected to the sensor, and one end of the second wiring portion for the first wire is electrically connected to an electrode of the battery cell.

11. The battery pack of claim 1, wherein the plurality of wires and a cell housing of one of the battery cells are composed of a same material.

12. The battery pack of claim 1, wherein the plurality of wires includes nickel (Ni).

13. The battery pack of claim 1, wherein the lead frame is electrically connected to the circuit board.

14. The battery pack of claim 1, further comprising a housing that defines a space to receive the plurality of battery cells, the lead frame, the sensor, the circuit board, and the plurality of wires.

15. A cleaner comprising the battery pack of claim 1.

16. A battery pack, comprising:
    a plurality of battery cells;
    a sensor that monitors a status of the plurality of battery cells;
    a circuit board at which the sensor is located; and
    a plurality of wires including a first wire that electrically connects the sensor and the plurality of battery cells, and a second wire that electrically connects the circuit board and another one of the plurality of battery cells,
    wherein each of the first wire and the second wire includes a first segment and a second segment, the second segment being configured to melt at a lower current level than the first segment, wherein at least a portion of the second segment of the first wire is positioned to overlap a first region between an adjacent first pair of the plurality of battery cells, and at least a portion of the second segment of the second wire is positioned to overlap a second region between an adjacent second pair of the plurality of battery cells, the first pair and the second pair being different, wherein a width of the second segment in the first direction is less than a width of the first segment in the first direction, and wherein a length of the second segment in the second direction is less than a length of the first segment in the second direction.

\* \* \* \* \*